United States Patent
Smith et al.

(10) Patent No.: US 12,175,224 B2
(45) Date of Patent: *Dec. 24, 2024

(54) SOFTWARE SYSTEMS AND METHODS FOR MULTIPLE TALP FAMILY ENHANCEMENT AND MANAGEMENT

(71) Applicant: C Squared IP Holdings LLC, Scottsdale, AZ (US)

(72) Inventors: Scott Andrew Smith, Ocala, FL (US); Christopher Graham Smith, Aurora, CO (US); Kevin David Howard, Mesa, AZ (US)

(73) Assignee: C SQUARED IP HOLDINGS LLC, Scottsdale, AZ (US)

(*) Notice: Subject to any disclaimer, the term of this patent is extended or adjusted under 35 U.S.C. 154(b) by 0 days.

This patent is subject to a terminal disclaimer.

(21) Appl. No.: 18/586,490

(22) Filed: Feb. 25, 2024

(65) Prior Publication Data

US 2024/0192937 A1 Jun. 13, 2024

Related U.S. Application Data

(63) Continuation of application No. 18/241,943, filed on Sep. 4, 2023, now Pat. No. 11,914,979, which is a continuation of application No. 18/102,638, filed on Jan. 27, 2023, now Pat. No. 11,861,336, which is a continuation-in-part of application No. 17/887,402, filed on Aug. 12, 2022, now Pat. No. 11,687,328.

(60) Provisional application No. 63/303,945, filed on Jan. 27, 2022, provisional application No. 63/232,576, filed on Aug. 12, 2021.

(51) Int. Cl.
*G06F 8/41* (2018.01)
*G06F 11/36* (2006.01)

(52) U.S. Cl.
CPC .......... *G06F 8/447* (2013.01); *G06F 11/3664* (2013.01)

(58) Field of Classification Search
CPC ........ G06F 8/4441; G06F 8/4434; G06F 8/45; G06F 9/455
See application file for complete search history.

(56) References Cited

U.S. PATENT DOCUMENTS

| | | | |
|---|---|---|---|
| 2017/0052960 A1* | 2/2017 | Alizadeh-Shabdiz | G06F 16/285 |
| 2020/0210162 A1* | 7/2020 | Howard | G06F 8/45 |
| 2020/0242268 A1* | 7/2020 | Epasto | G06F 16/285 |
| 2020/0342539 A1* | 10/2020 | Doney | G06Q 20/3829 |
| 2021/0064639 A1* | 3/2021 | Wang | G06N 3/08 |
| 2021/0397703 A1* | 12/2021 | Stocks | G06F 21/577 |

* cited by examiner

*Primary Examiner* — Wei Y Zhen
*Assistant Examiner* — Amir Soltanzadeh
(74) *Attorney, Agent, or Firm* — Skaar Ulbrich Macari, P.A.

(57) ABSTRACT

Software systems and methods convert algorithms and software codes into time affecting linear pathways (TALPs) via decomposition and convert paired Input/Output (I/O) datasets into TALPs via Value Complexity polynomials. Generated TALPs can be enhanced through merging with other TALPs. TALPs can be grouped by matching the outputs of the TALP-associated prediction polynomials with some set of given criteria into families and cross-families that are useful in a new type of software optimization that allows for output values of grouped TALPs to be modeled, pooled, discretized and optimized to enhance goals or meet user goals.

20 Claims, 36 Drawing Sheets

| Example Input Dataset Size and Space Allocation | |
|---|---|
| d-values | s-values |
| 2 | 3 |
| 4 | 15 |
| 6 | 31 |

Table 1: Example Sorted Input Dataset Size and Space

FIG. 3A

| Example Source Values Table | |
|---|---|
| d-values | s-values |
| 1 | 1.000 |
| 2 | 4.333 |
| 3 | 10.333 |

Table 2: Example Source Values

FIG. 3B

| Scaled d-values | Example Scaled Target Values | | | | |
|---|---|---|---|---|---|
| | | | | | |
| 1 | | 0.000 | 0.000 | 1.000 | 1.000 | 1 |
| 2 | | 0.693 | 1.000 | 2.000 | 2.828 | 4 |
| 3 | | 1.099 | 1.585 | 3.000 | 5.196 | 9 |
| ... | | ... | ... | ... | ... | ... |
| n | | $\log_e n$ | $\log_2 n$ | $n$ | $n^{1.5}$ | $n^2$ |

Function Terms as Column Header

Table 3: Example Target Values

FIG. 3C

Table 4: Example New Source Values

Table 5: Example Shifted Source Values

Simulation and Selection Work Flow

**TALP Family Generation Detail:
General Embodiment

TALP Cross-Family Generation Details

Stand-Alone (Single Server) System Examples

Arrays of Input Variable Attribute Values to TALP Polynomials ⟵ 304

Output Data Attributes Values:

$$v_{n,m} = \sum_{i=1}^{n} \left\{ \sum_{j=1}^{m} \{H_i(x_{i,j}) \times h_{min}\} \right\}$$

| $v_{1,1}$ | $v_{1,2}$ | $v_{1,3}$ | $v_{1,4}$ | ... | $v_{1,m}$ |
|---|---|---|---|---|---|
| $v_{2,1}$ | $v_{2,2}$ | $v_{2,3}$ | $v_{2,4}$ | ... | $v_{2,m}$ |
| ... | ... | ... | ... | ... | ... |
| $v_{n,1}$ | $v_{n,2}$ | $v_{n,3}$ | $v_{n,4}$ | ... | $v_{n,m}$ |

$$Pool = \sum_{i=1}^{n} \sum_{j=1}^{m} \{H(x_{i,j}) \times h_{min}\}$$

$$time = \sum_{i=1}^{n} \sum_{j=1}^{m} \{T_i(t_{i,j}) \times t_{i_{min}}\}$$

$$space = \sum_{i=1}^{n} \sum_{j=1}^{m} \{\varepsilon_i(s_{i,j}) \times s_{i_{min}}\}$$

306 ⟶ Advanced Value Complexity Type I

308 ⟶ Advanced Value Complexity Type II

310 ⟶ Advanced Time Complexity

312 ⟶ Advanced Space Complexity

| $x_{1,1}$ | $x_{1,2}$ | $x_{1,3}$ | $x_{1,4}$ | ... | $x_{1,m}$ |
|---|---|---|---|---|---|
| $x_{2,1}$ | $x_{2,2}$ | $x_{2,3}$ | $x_{2,4}$ | ... | $x_{2,m}$ |
| ... | ... | ... | ... | ... | ... |
| $x_{n,1}$ | $x_{n,2}$ | $x_{n,3}$ | $x_{n,4}$ | ... | $x_{n,m}$ |

| $t_{1,1}$ | $t_{1,2}$ | $t_{1,3}$ | $t_{1,4}$ | ... | $t_{1,m}$ |
|---|---|---|---|---|---|
| $t_{2,1}$ | $t_{2,2}$ | $t_{2,3}$ | $t_{2,4}$ | ... | $t_{2,m}$ |
| ... | ... | ... | ... | ... | ... |
| $t_{n,1}$ | $t_{n,2}$ | $t_{n,3}$ | $t_{n,4}$ | ... | $t_{n,m}$ |

| $s_{1,1}$ | $s_{1,2}$ | $s_{1,3}$ | $s_{1,4}$ | ... | $s_{1,m}$ |
|---|---|---|---|---|---|
| $s_{2,1}$ | $s_{2,2}$ | $s_{2,3}$ | $s_{2,4}$ | ... | $s_{2,m}$ |
| ... | ... | ... | ... | ... | ... |
| $s_{n,1}$ | $s_{n,2}$ | $s_{n,3}$ | $s_{n,4}$ | ... | $s_{n,m}$ |

FIG. 15

Cross-Family Generation Detail: Investment Software Embodiment

Data Discretization Optimization (DDO) Engine Details

Risk/Return Allocation Vehicle (rRAV) Engine Details

Cash Flow Distribution

Time, Event, Value Graph

SOFTWARE SYSTEMS AND METHODS FOR MULTIPLE TALP FAMILY ENHANCEMENT AND MANAGEMENT

RELATED APPLICATIONS

This Application is a continuation of U.S. patent application Ser. No. 18/241,943, filed Sep. 4, 2023, which is a continuation of U.S. patent application Ser. No. 18/102,638, filed Jan. 27, 2023 and now issued as U.S. Pat. No. 11,861,336, which is a continuation-in-part of U.S. patent application Ser. No. 17/887,402, filed Aug. 12, 2022 and now issued as U.S. Pat. No. 11,687,328, and claims priority to and the benefit of U.S. Provisional Patent Application No. 63/303,945, filed Jan. 27, 2022, and U.S. patent application Ser. No. 17/887,402 claims priority to and the benefit of U.S. Provisional Patent Application No. 63/232,576, filed Aug. 12, 2021; with each of the referenced applications and disclosures full incorporated herein by reference.

TECHNICAL FIELD

This disclosure generally relates to software systems and methods and, more particularly, to software systems and methods of time affecting linear pathway (TALP) management and TALP family enhancement.

BACKGROUND OF THE INVENTION

There exist many software products that analyze streams of input data and generate predictive outcomes or take user requests and analyze data for patterns. Examples include disease-spreading analysis systems like Airfinity's Cardio Metabolic & Vascular™ product, traffic analysis software like the TRANSOFT SOLUTIONS Vehicle Turn Simulation™ product, and investment analysis and fund or portfolio management systems like multiple products from IBM's MorningStar™.

Technology is a major part of the United States economy, with software playing a major role. By 2020, software alone accounted for $933 billion dollars of the US technology economy's $1.9 trillion dollars, which is 49%. The domination of software in technology will likely continue for the foreseeable future as almost every US company generates and uses software. Consider that in 2022, the average software engineer earns $127,342 per year, with an expected shortfall of 1.2 million software engineers by 2026. This means organizations will need to use non-software engineering personnel to meet their software creation, update, and repair needs. This, in turn, implies a need for new software tools and management techniques to automatically extend existing software functionality using new algorithmic solutions without sacrificing processing performance.

SUMMARY OF THE INVENTION

The present invention converts algorithms and software codes into time affecting linear pathways (TALPs) and converts paired Input/Output (I/O) datasets into TALPs with associated prediction polynomials. These system-generated TALPs can be merged with enhancement TALPs as part of an enhancement and management system. After TALPs are generated, their associated prediction polynomials are used in simulation. Comparing the simulated output values with an associated set of acceptance criteria output values allows for the automatic selection of TALPs. The prediction polynomials of these TALPs can be modeled and pooled into optimum groups by use by, or distribution to, system users. Alternatively, in various embodiments, these system-generated and enhanced TALPs are grouped into families and cross-families. Uniquely, the TALP Families disclosed herein concern grouping TALPs by matching the outputs of the TALP-associated prediction polynomials with some set of given Family or Cross-Family acceptance criteria. Output data from TALPs that are grouped into families and/or cross-families are modeled, combined (e.g., pooled), discretized, and optimized, which is a new type of software optimization to enhance or meet user goals.

Particular embodiments of the present invention, e.g., the Multiple TALP Family Enhancement and Management (MTF E&M) system, include stand-alone server, client-server, and cloud-based systems. Algorithms and software codes are converted directly into TALPs using TALP decomposition and raw input data with its associated output data (e.g., paired I/O datasets) are converted directly into Value Complexity polynomials, which are equivalent to TALPs. TALPs or their equivalent are then executed using test input data values to generate prediction polynomials: Advanced Time Complexity, Advanced Space Complexity, and, if necessary, Value Complexity.

Various embodiments of the present invention can include a method and system of software enhancement and management that comprises inputting one or more data transformation algorithms, wherein the one or more data transformation algorithms do not include software application source code, decomposing the one or more data transformation algorithms into a plurality of TALPS, executing the plurality of TALPs using a set of test data to generate associated value complexity prediction polynomials, advanced time complexity prediction polynomials, and advanced space complexity prediction polynomials, simulating TALP behavior by executing the generated, associated prediction polynomials, selecting one or more of the plurality of TALPs based on acceptance criteria, wherein the acceptance criteria includes one or more expected input to output value ranges, one or more expected TALP execution timings, and one or more expected TALP memory allocation requirements, modeling one or more outcomes with actual expected input data values using the value complexity prediction polynomials, the advanced time complexity prediction polynomials, and the advanced space complexity prediction polynomials for each of the selected one or more TALPs, and defining optimum TALP groupings for solution sets.

BRIEF DESCRIPTION OF THE DRAWINGS

The accompanying drawings, which are incorporated herein and form part of the specification, illustrate various embodiments of the present disclosure and, together with the description, further explain the principles of the disclosure and enable a person skilled in the pertinent art to make and use the embodiments disclosed herein. In the drawings, like reference numbers indicate identical or functionally similar elements.

FIG. 3A is a table showing example sorted input dataset size and space, in accordance with embodiments of the present invention.

FIG. 3B is a table showing example source values, in accordance with embodiments of the present invention.

FIG. 3C is a table showing example target values, in accordance with embodiments of the present invention.

FIG. 15 is a diagram showing an array of input variable attribute values converted into an array (from investment software) of Value Complexity I values, a single Value Complexity II value, an Advanced Time Complexity value, and an Advanced Space Complexity value, in accordance with embodiments of the present invention.

DETAILED DESCRIPTION

Figure 1:
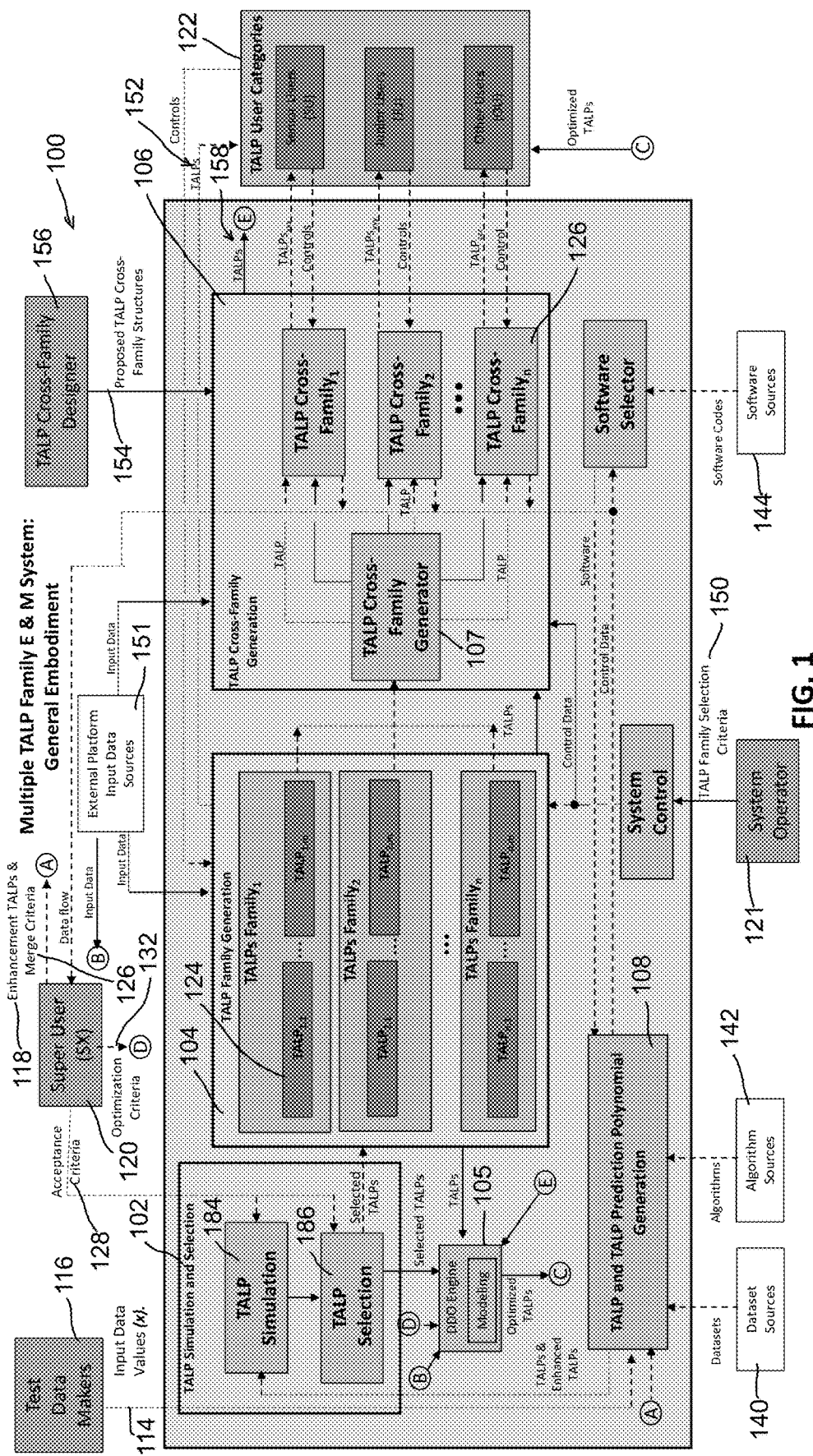
FIG. 1 is a diagram showing an example of the general MTF E&M system which can receive datasets, algorithms, or software codes and convert them into TALPs to be modeled and pooled for use by, or distribution to, various users or placed into families or cross-families of TALPs for use by, or distribution to, various classes of users, in accordance with embodiments of the present invention.

The present invention provides a multiple TALP family enhancement and management system (MTF E&M system) comprised of time-affecting linear pathway (TALP) and TALP prediction polynomial generation, TALP enhancement, TALP simulation and selection, TALP modeling, TALP family/cross-family generation, and family/cross-family TALP output data optimization. TALPs are generated from paired Input/Output (I/O) datasets or from the decomposition of algorithms and/or software codes. TALPs are executed using test input data to generate prediction polynomials. System-generated TALPs can be merged with enhancement TALPs. Using TALP-associated prediction polynomials and acceptance criteria comprised of paired I/O datasets that represent acceptable TALP behavior, system-generated and enhanced TALPs are simulated and selected. The TALP-associated prediction polynomials of selected TALPs are then modeled using actual input data values from external platforms, and their output data values pooled, discretized, and optimized for use by, or distribution to, system users. Alternatively, the TALP-associated prediction polynomials of selected TALPs are executed using the input values from the TALP Family Selection criteria for inclusion in TALP Families. The associated output values of these TALP-associated prediction polynomials are compared to the associated output values of the TALP Family Selection criteria. TALP-associated prediction polynomials from each family can be re-executed using input from the Proposed TALP Cross-Family Structure criteria, with output value comparison for inclusion in one of those structures. TALP-associated prediction polynomials for each TALP in each TALP Family and each TALP Cross-Family are modeled using actual input data from external platforms, and their output data values pooled, discretized, and optimized for use by, or distribution to, system users.

A TALP is an execution pathway through an algorithm or software code which includes looping structures. TALPs allow for the direct and automatic selection of a pathway through an algorithm or software code via the examination of the values of input non-loop-control variable attributes. Time prediction for TALPs occurs through varying the input loop control variable attributes and generating a time prediction polynomial. This means that examining the values of input loop control variable attributes is enough to know the processing time of a TALP. The output value prediction of a TALP occurs through varying the attribute domain of the input variable attributes that affect output values forming an output prediction polynomial. This means that it is possible to know the output values of a TALP through the examination of the input variables. Various TALP methods and systems are disclosed in U.S. Pat. No. 11,520,560, which is hereby fully incorporated herein by reference and can be implemented with various aspects, embodiments, methods, and systems of the present invention.

Various devices or computing systems can be included and adapted to process and carry out the aspects, computations, and algorithmic processing of the software systems and methods of the present invention. Computing systems and devices of the present invention may include a processor, which may include one or more microprocessors and/or one or more circuits, such as an application specific integrated circuit (ASIC), field-programmable gate arrays (FPGAs), etc. Further, the devices can include a network interface. The network interface is configured to enable communication with a communication network, other devices and systems, and servers, using a wired and/or wireless connection.

The devices or computing systems may include memory, such as non-transitive, which may include one or more non-volatile storage devices and/or one or more volatile storage devices (e.g., random access memory (RAM)). In instances where the computing devices include a microprocessor, computer readable program code may be stored in a computer readable medium or memory, such as, but not limited to drive media (e.g., a hard disk or SSD), optical media (e.g., a OVO), memory devices (e.g., random access memory, flash memory), etc. The computer program or software code can be stored on a tangible, or non-transitive, machine-readable medium or memory. In some embodiments, computer readable program code is configured such that when executed by a processor, the code causes the device to perform the steps described above and herein. In other embodiments, the device is configured to perform steps described herein without the need for code.

It will be recognized by one skilled in the art that these operations, algorithms, logic, method steps, routines, sub-routines, and modules may be implemented in software, in firmware, in special purpose digital logic, and any combination thereof without deviating from the spirit and scope of the present invention as recited within the claims attached hereto.

The devices or computing devices may include an input device. The input device is configured to receive an input from either a user (e.g., admin, user, etc.) or a hardware or software component—as disclosed herein in connection with the various user interface or automatic data inputs. Examples of an input device include a keyboard, mouse, microphone, touch screen and software enabling interaction with a touch screen, etc. The devices can also include an output device. Examples of output devices include monitors, televisions, mobile device screens, tablet screens, speakers, remote screens, etc. The output device can be configured to display images, media files, text, video, or play audio to a user through speaker output.

Server processing systems for use or connected with the systems of the present invention, can include one or more microprocessors, and/or one or more circuits, such as an application specific integrated circuit (ASIC), field-programmable gate arrays (FPGAs), etc. A network interface can be configured to enable communication with a communication network, using a wired and/or wireless connection, including communication with devices or computing devices disclosed herein. Memory can include one or more non-volatile storage devices and/or one or more volatile storage devices (e.g., random access memory (RAM)). In instances where the server system includes a microprocessor, computer readable program code may be stored in a computer readable medium, such as, but not limited to drive media (e.g., a hard disk or SSD), optical media (e.g., a DVD), memory devices, etc.

FIG. 1 is a diagram showing an example of a multiple TALP Family Enhancement and Management (MTF E&M) system 100. The exemplary MTF E&M System shown in FIG. 1 is composed of four primary components: TALP Simulation and Selection 102, TALP Family Generation 104, TALP Cross-Family Generation 106, and TALP and TALP Prediction Polynomial Generation 108.

Figure 1A:
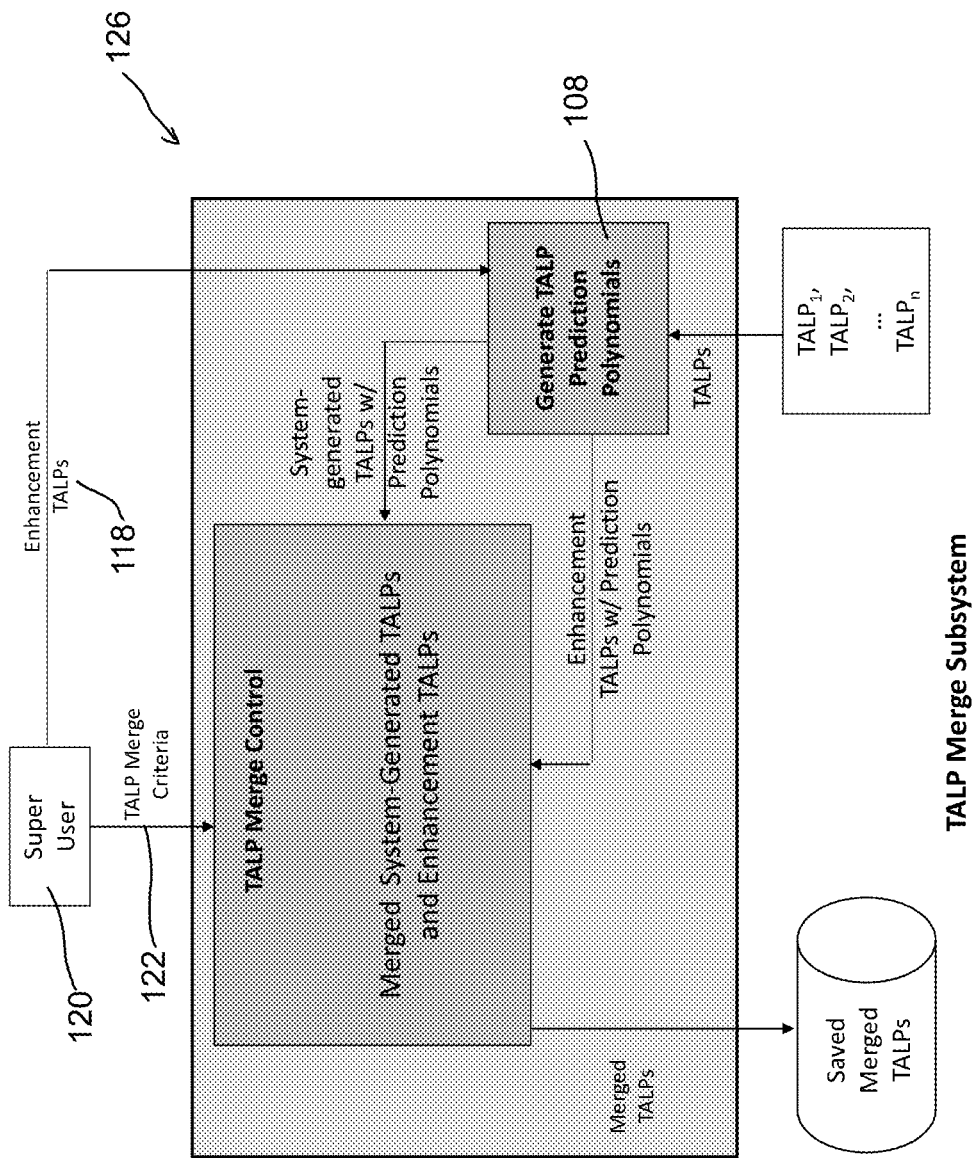
FIG. 1A shows a diagram where system-generated TALPs with their prediction polynomials are merged with externally defined enhancement TALPs from the Super User, in accordance with embodiments of the present invention.
Figure 1B:
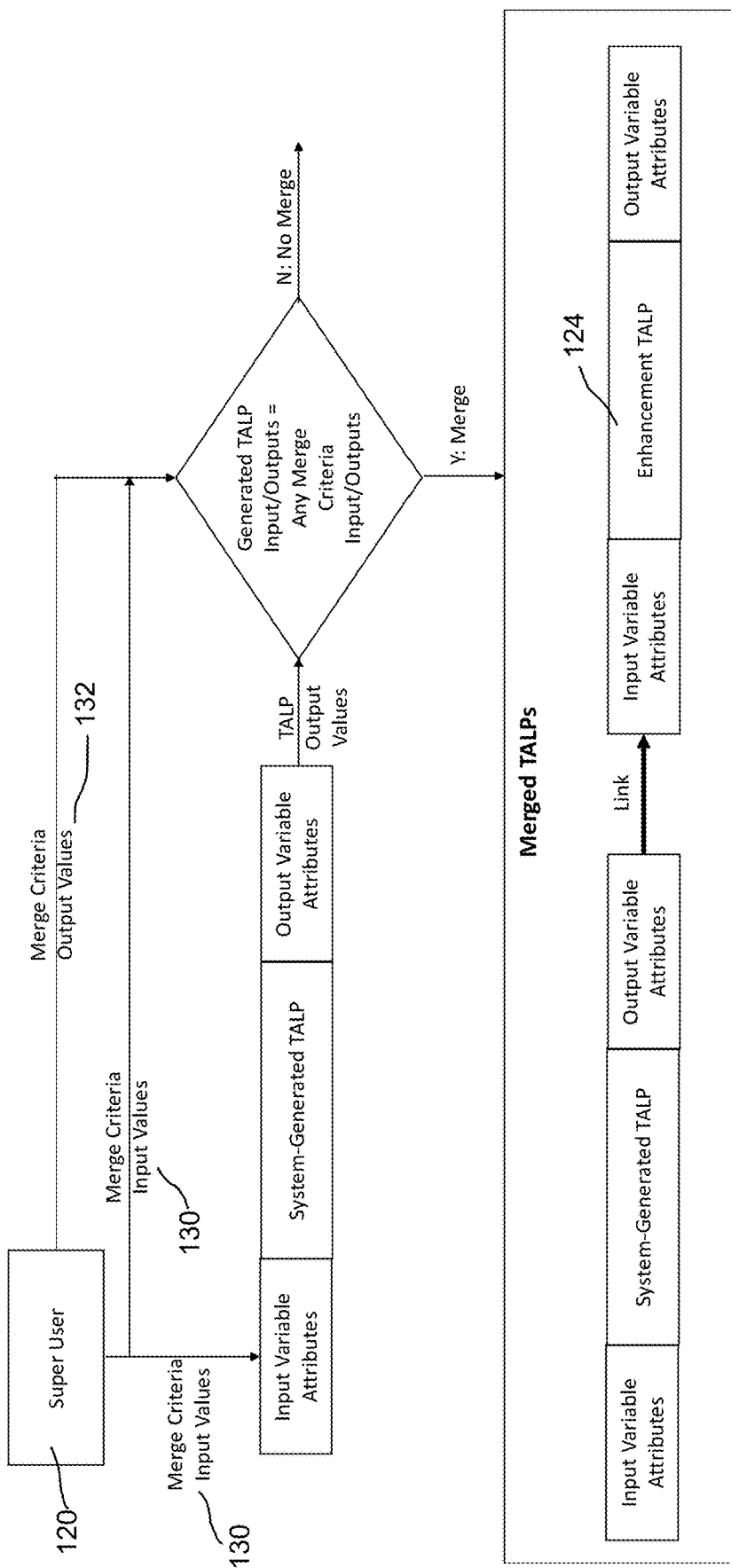
FIG. 1B shows a diagram detailing the merger of a system-generated TALP and an enhancement TALP from the Super User, in accordance with embodiments of the present invention.

Referring to FIGS. 1-1B, the present invention comprises software systems and methods that use TALPs that are generated from detected paired I/O dataset values (automatic conversion to TALP form), algorithms, and/or software codes. The generated TALPs, regardless of their origin, can be used to create a set of executable prediction polynomials 112, as shown for FIG. 3 and FIG. 4. These prediction polynomials are generated in the TALP and TALP Prediction Polynomial Generation component 108 of the MTF E&M system 100, and General embodiment, by varying input data values 114 from the Test Data Makers 116, giving associated output values, timings, and memory allocation. These output values, timings, and memory allocation values are used in an extended source values table, from which the prediction polynomials are constructed. Once a TALP with its associated prediction polynomials has been generated, then it is possible for that TALP's performance to be enhanced by merging the system-generated TALP with another TALP called an enhancement TALP 118 that originates from the Super User 120. This merging is shown in FIG. 1A and FIG. 1B.

FIG. 1A shows a diagram whereby the Super User 120 sends both merge criteria 122 and enhancement TALPs 118 with their associated prediction polynomials to the TALP Merge subcomponent 126 of the system's TALP and TALP Prediction Polynomial Generation component 108. The TALP Merge subcomponent uses the merge criteria and the enhancement TALPs to determine if an enhancement TALP is to be merged with some system-generated TALP. Merging for the system 100 means linking the output of one TALP to the input of another TALP. There are two possible ways for a single system-generated TALP to be merged with a single enhancement TALP: (1) the output of the system-generated TALP can be the input to the enhancement TALP, or (2) the output of the enhancement TALP can be the input of the system-generated TALP. More than one enhancement TALP can be linked to a single system-generated TALP.

FIG. 1B shows a workflow of a system-generated TALP receiving the merge criteria input values 130 from the Super User 120. The system-generated TALP's prediction polynomials execute using the input values to generate associated output values. The output values are then compared to the merge criteria output values 132 to determine a match. System-generated TALP prediction polynomials whose output match the merge criteria are shown to be linked to an associated enhancement TALP 124.

After TALP generation, the prediction polynomials of the system-generated and enhanced TALPs are used in simulation 184. These prediction polynomials are executed using input data from acceptance criteria 128, giving associated outputs. Comparing the simulated output values with the associated set of acceptance criteria output values allows for the automatic selection 186 of TALPs. Once the TALP is simulated and selected, it is then either modeled in the Data Discretization Optimization Engine (DD) 105 using actual input data values from external platforms and made available for use by, or distribution directly to, a TALP user 122 or matched to criteria for placement into a TALP Family 124 or TALP Cross-Family 126. Selected TALPs are added to TALP families based on the TALP Family Selection criteria. TALPs from more than one TALP family can be combined into TALP Cross-Families using proposed TALP Cross-Family structures. The behavior of each TALP in a TALP Families 124 or TALP Cross-Families 126 can be modeled in the Data Discretization Optimization Engine 105 using actual input data values from external platforms, and their output data values pooled, discretized, and optimized for use by, or distribution to, system users.

Various embodiments of the systems and methods of the present invention perform the following communication and processing:

1) In order to generate TALPs and TALP prediction polynomials 112, the "TALP and TALP Prediction Polynomial Generation" component 108 of the MTF E&M system 100 receives paired I/O Datasets (called Datasets) from Dataset Sources 140, algorithms from Algorithm Sources 142, software codes from Software Sources 144, and input data values from the Test Data Makers 116. For paired I/O Datasets, there is no algorithm or software code to decompose into TALPs; instead, a Value Complexity polynomial that represents a TALP is generated. Once a TALP has been generated, its behavior can be enhanced by merging enhancement TALPs, from the Super User, with the system-generated TALPs.

2) The "TALP Simulation and Selection" component 102 of the MTF E&M system 100 receives the generated TALPs with their associated prediction polynomials and the acceptance criteria (comprised of a set of acceptable input values with associated acceptable output values).
   a. The "TALP Simulation and Selection" component 102 activates its "TALP Simulation" subcomponent 184 using the list of generated TALPs with their associated prediction polynomials from the "TALP and TALP Prediction Polynomial Generation" component 108 and the acceptable input values of the acceptance criteria from the Super User 120. The various TALP prediction polynomials are executed using these acceptable input values, generating a set of associated predicted output values for each TALP.

b. The "TALP Simulation and Selection" component 102 activates its "TALP Selection" subcomponent 186 using these acceptable input values with their generated associated predicted output values from the TALP simulation. These predicted output values are compared to the acceptable output values of the Acceptance Criteria 128, creating a set of selected TALPs when the generated predicted output values match the acceptable output values. Selected TALPs are either modeled using actual input data values from external platforms for direct use by system users or executed using the input values from the TALP Family Selection criteria for inclusion in TALP Families.

3) The "TALP Family Generation" component 104 of the MTF E&M system 100 receives the selected TALPs with their associated prediction polynomials from the "TALP Simulation and Selection" component 102 and the TALP Family Selection Criteria 150 (comprised of a set of acceptable input values with associated output values for each family type) from the System Operator 121. The prediction polynomials associated with each selected TALP executed using the acceptable family input values generating a set of output values that are compared to the acceptable family output values for inclusion into the matching family.

a. After inclusion in a TALP Family, the prediction polynomials of each TALP in each Family are executed using input data from external platform TALP input data sources 151, generating a pool of output values 152 made available to TALP User Categories.

b. Alternately, after inclusion in a TALP Family, the prediction polynomials of each TALP in each Family are modeled in the DDO Engine 105 then pooled, discretized and optimized for use by, or distribution to, the various TALP User Categories.

4) The "TALP Cross-Family Generator" component 107 of the MTF E&M system 100 receives the TALPs with their associated prediction polynomials from the families of the "TALP Family Generation" component 104 and the Proposed TALP Cross-Family Structure 154 (comprised of a set of cross-family acceptable input values with associated output values for each cross-family type) from the TALP Cross-Family Designer 156. The prediction polynomials associated with each TALP of each TALP Family are executed using the acceptable cross-family input values generating a set of output values that are compared to the acceptable cross-family output values, for inclusion into the matching cross-family.

a. After inclusion in a TALP Cross-Family, prediction polynomials of each TALP in each cross-family are executed using external platform input data from actual TALP input data sources, generating a pool of output values 158 made available to TALP User Categories.

b. Alternately, after inclusion in a TALP Cross-Family, the prediction polynomials of each TALP in each Family are modeled in the DDO Engine 105 then pooled, discretized and optimized for use by, or distribution to, the various TALP User Categories.

Figure 2:
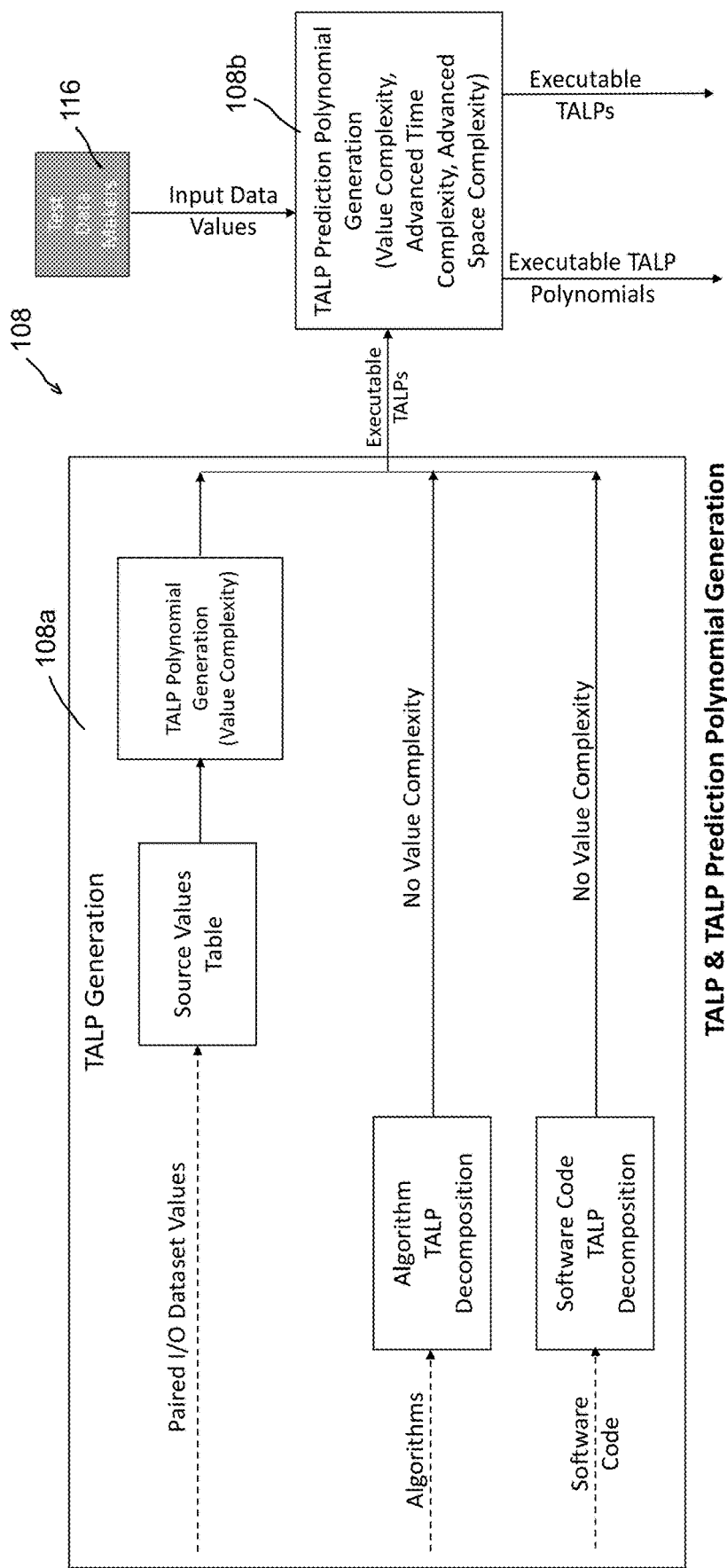
FIG. 2 is a diagram showing multiple types of inputs converted into TALPs that are used to generate TALP prediction polynomials, in accordance with embodiments of the present invention.

FIG. 2 is a diagram showing the details of the TALP and TALP Polynomial Generation component 108 of the MTF E&M system 110: general embodiment, including TALP generation 108a and TALP Prediction Polynomial Generation 108b. The polynomial form of an algorithm occurs when a set of input variable attribute values can be used to generate a set of output variable attribute values and that those values approximate the original algorithm behavior to within some epsilon. This means that a predictive, executable polynomial (Value Complexity) that is formed from data detection represents an algorithm in polynomial form. That is, it is possible to automatically generate TALPs from sets of detected data. TALPs can also be generated from the decomposition of algorithms and software code.

Executing the generated TALPs using test data from the Test Data Maker 116 allows the system to generate both advanced time complexity and advanced space complexity polynomials. Advanced time complexity uses input variable attribute values to predict the processing time. Descaling the Advanced Time Complexity polynomial gives the Advanced Speedup polynomial. Speedup describes the processing speed from a given input variable attribute value. Advanced space complexity uses input variable attribute values to predict memory allocation. Descaling the Advanced Space-Complexity polynomials gives the Freeup polynomials. Freeup describes the memory requirement for a given input variable attribute value. There are three Advanced Space Complexity polynomials for the following: Random Access Memory Allocation, Cache Memory Allocation, and Output Memory Allocation. Because there are three Advanced Space Complexity polynomials, there are also three Freeup polynomials.

Figure 3:
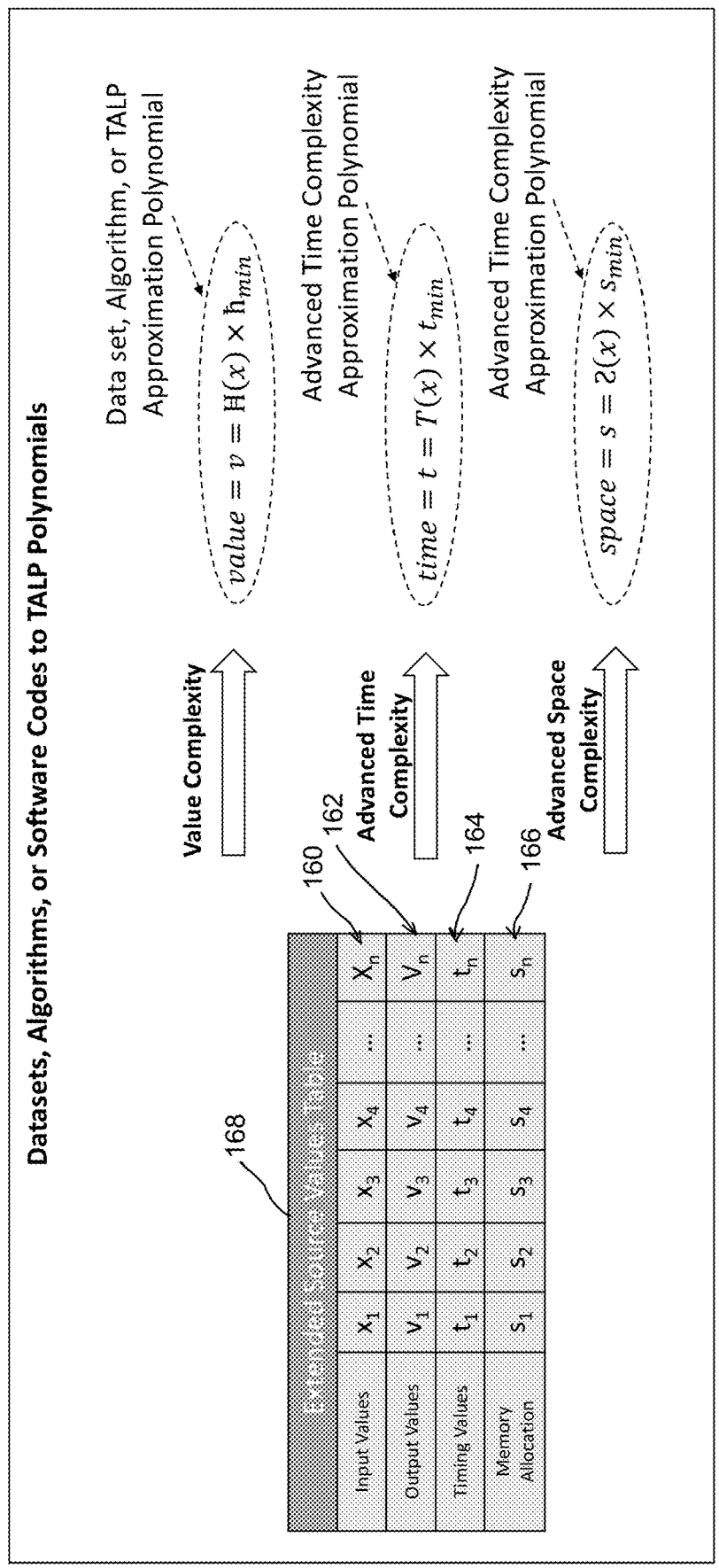
FIG. 3 is a diagram showing an input variable attribute vector, an associated output variable attribute vector, an associated timing vector, and an associated memory allocation vector converted into predictive polynomials for Value Complexity, Advanced Time Complexity, and Advanced Space Complexity, in accordance with embodiments of the present invention.

FIG. 3 is a diagram showing an input variable attribute vector 160 ($x_1$ through $x_n$), an associated output variable attribute vector 162 ($v_1$ through $v_n$), an associating timing variable attribute vector 164 ($t_1$ through $t_n$) and an associated memory allocation variable attribute vector 166 ($s_1$ through $s_n$) in an extended source values table.

The vectors are accessed pairwise: Input Values and Output Values, Input Values and Timing Values, Input Values and Memory Allocation. These pairs are used to generate respectively: Value Complexity, Advanced Time Complexity, and Advanced Space Complexity. TALP values can be generated for any valid set of input values as long as the input value is greater than the minimum value used to create the Value Complexity polynomial, the Advanced Time Complexity polynomial, or Advanced Space Complexity polynomial.

Below shows an example of how to construct polynomials from the various data vector parings. In this example, an advanced space complexity polynomial is generated from an executable software code pathway:

Example Advanced Time Complexity Polynomial Generation

A table called the Source Values table containing ordered, scaled input dataset sizes and associated scaled space values is compared to a table called the Target Values table containing a set of scaled dataset sizes and associated space values generated from some pre-existing functions depicted as the column headers, following the steps below.

1. Referring to Table 170 of FIG. 3A, a value for an input dataset size d is divided evenly and successively (varying the input dataset size) then the TALP's associated executable code is executed by the system to find the associated space values s which are sorted and stored in the Input Dataset Size and Space table.

2. Referring to Table 172 of FIG. 3B, the input dataset size d and associated space values s are scaled by their respective smallest received values, $d_{min}$ and $s_{min}$, and saved in a Source Values table. In this example, $d_{min}=2$ and $s_{min}=3$. Scaling gives the Source Values table.

3. Referring to Table 174 of FIG. 3C, the scaled space values s of the Source Values table are compared to those found in a previously created Target Values table.

4. The functions (polynomial terms) in the headers of the columns of the Target Values table are in ascending order. Zero values in the Target Values table are not compared to the corresponding Source Values table space value, but not comparing a row does not eliminate the corresponding Target table column function header from consideration for inclusion in the final polynomial. When comparing the Source Values table space values to corresponding Target Values table space values, all Source Values table s values in a column will be at least one of the following:
   a. Greater than or equal to all associated Target Values table values in a column (plus or minus some epsilon value),
   b. Less than or equal to all associated Target Values table values in a column (plus or minus some epsilon value), or
   C. All Source Values table e values are the same value (plus or minus some epsilon value).

The function header of any Target Values table column whose rows do not meet condition a or condition b above is eliminated from consideration for inclusion in the final polynomial, and a comparison is made using a different target column. If condition c is met, the value is considered a constant and added to a Saved Term List $f_{term}$. Condition c means the polynomial is complete, and the process jumps to Step 8.

5. When Source space values are compared to the corresponding Target space values, the closest column header that meets condition a or b is saved in the $f_{term}$ list and the process continues with Step 6. If no tested columns meet condition a or b then an error condition exists, and the "Error—stop processing" message is displayed. This comparison is a binary search process.

Figures 3D, 3E:
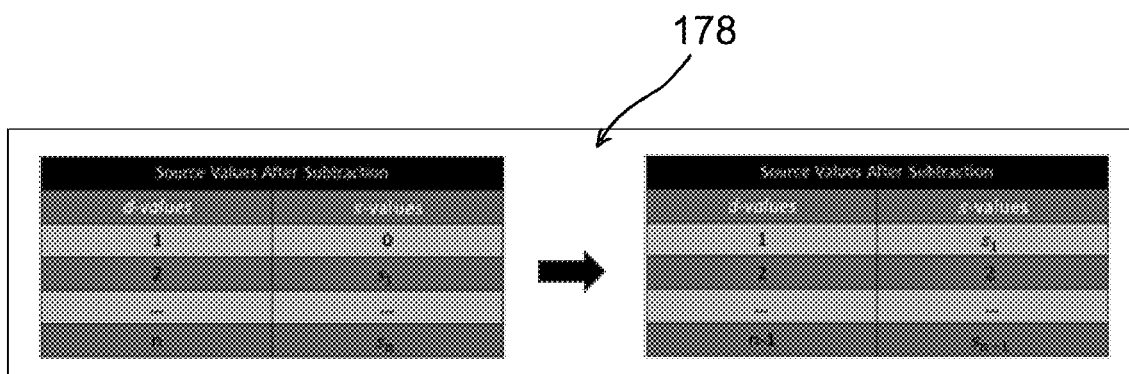
FIG. 3D is a table showing example new source values, in accordance with embodiments of the present invention.
FIG. 3E is a table showing example shifted source values, in accordance with embodiments of the present invention.

6. Referring to Table 176 of FIG. 3D, the selected Target Values table column's values are subtracted from the corresponding Source Value table space values, and those new values are saved in a temporary Source Values table. If the temporary Source space values contain any negative values, then the following found polynomial term may be a negative term in which case two versions of the term (negative and positive) are saved with the one whose maximum error (as calculated in step 9) is the smallest becoming the selected version. The absolute values of the temporary Source space values are saved as the new Source Values table.

7. Referring to Table 178 of FIG. 3E, if there are any computed zero values in the new Source Values table, the values of the current column below the zero are shifted to the row above, replacing the zero value. Step 4 is then repeated using the new Source Values table.

8. All saved terms in the $f_{term}$ list are summed, creating the predictive, monotonic polynomial $\mathcal{S}_v(d)$ for input variable attribute d. To de-scale this polynomial with its resulting scaled space value s, it is multiplied by the smallest original s value, called $s_{min}$, within the original Source Values table.

Equation 1 Variable Space Complexity as Monotonic Polynomial $$\mathcal{S}_v(d) = s_{min} \times \Sigma_{i=1}^{n} f_{term_i}$$

Coefficients are automatically calculated from this step. Two or more like terms are summed to produce the coefficient of the term. For example, summing $s^2$ and $s^2$ gives $2s^2$.

Figure 4:
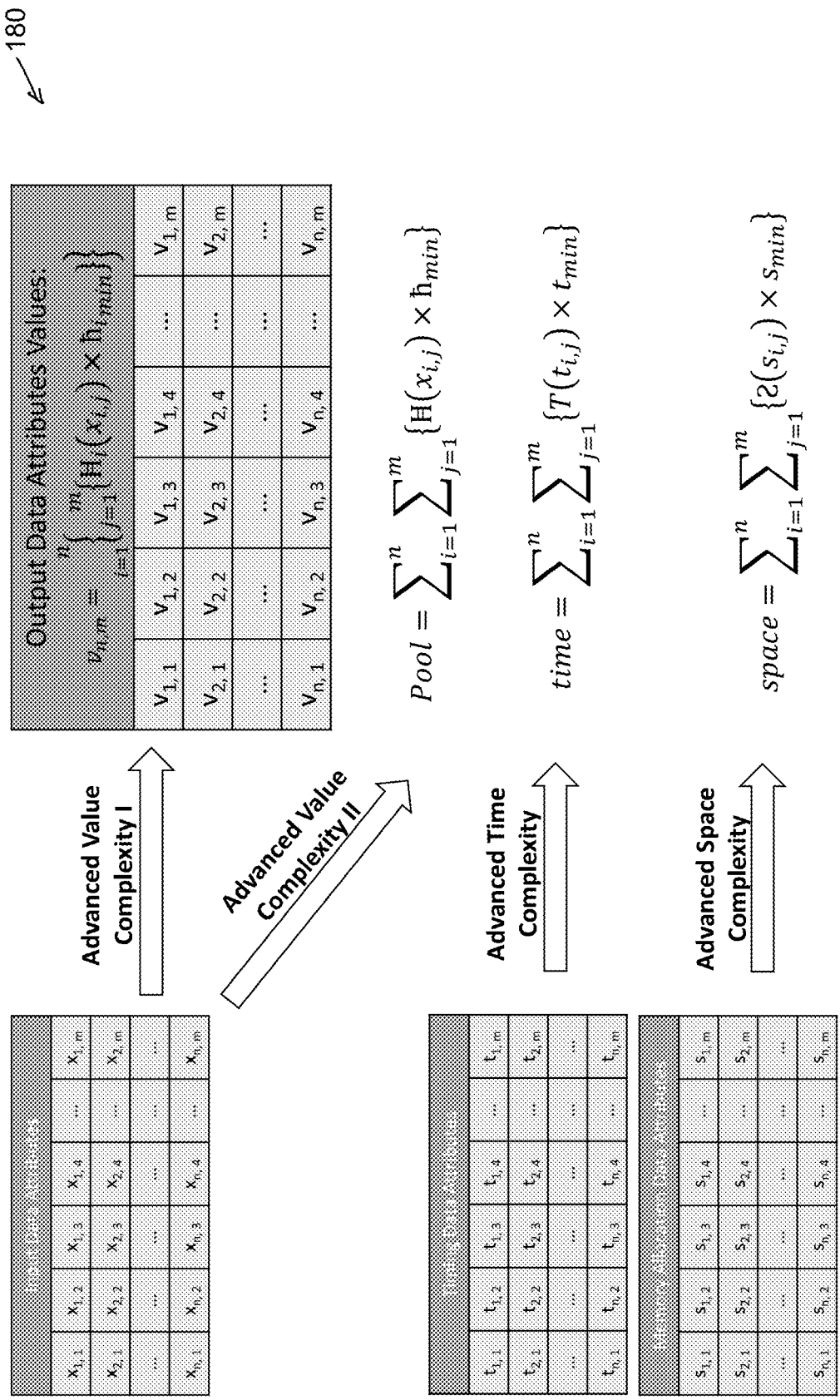
FIG. 4 is a diagram showing an array of input variable attribute values converted into an array of Value Complexity I values, a single Value Complexity II value, an Advanced Time Complexity value, and an Advanced Space Complexity value, in accordance with embodiments of the present invention.

FIG. 4 is a diagram 180 showing that multiple TALPs can be processed simultaneously using their associated prediction polynomials. An array of input values is constructed and used to generate either an array of output values from Value Complexity I or a single pooled value from Value Complexity II. The input variable attribute array is also used to generate an Advanced Time Complexity value via the use of an Advanced Time Complexity polynomial and an Advanced Space Complexity value via the use of an Advanced Space Complexity polynomial.

Figure 5:
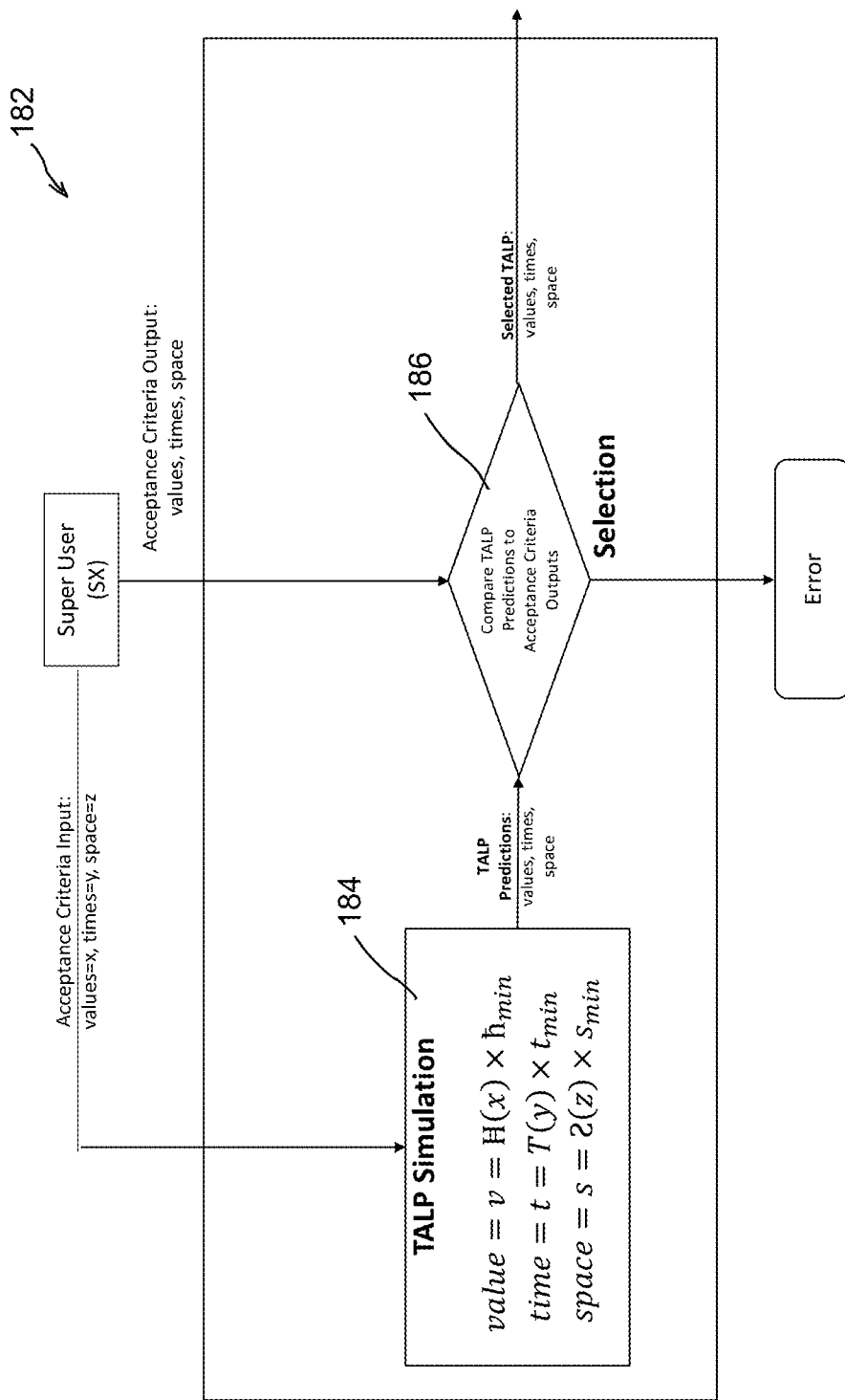
FIG. 5 shows a work flow of the TALP Simulation and Selection component of the MTF E&M system, in accordance with embodiments of the present invention.

FIG. 5 shows a work flow 182 of TALP polynomials used in the simulation and selection of TALPs, which is the first of the three primary components (e.g., 102) of the MFT E&M system 100. TALP simulation and selection is performed as follows:

TALP Simulation 184
1) The system receives Asset Acceptance Criteria input values, times, and memory allocation from the Super User.
2) The TALP polynomials are executed using the received Acceptance Criteria values.
3) The output values from the executed TALP polynomials are saved for selection comparison.

Selection 186
1) The system receives output acceptance criteria for values, timings, and memory allocation from the Super User.
2) The TALP polynomial's saved output data (values, timing, and memory allocation) from the simulation is compared to the received acceptance criteria output values, timings, and memory allocation.
3) The TALP polynomials whose saved output values match the received acceptance criteria output values are selected.

Figure 6:
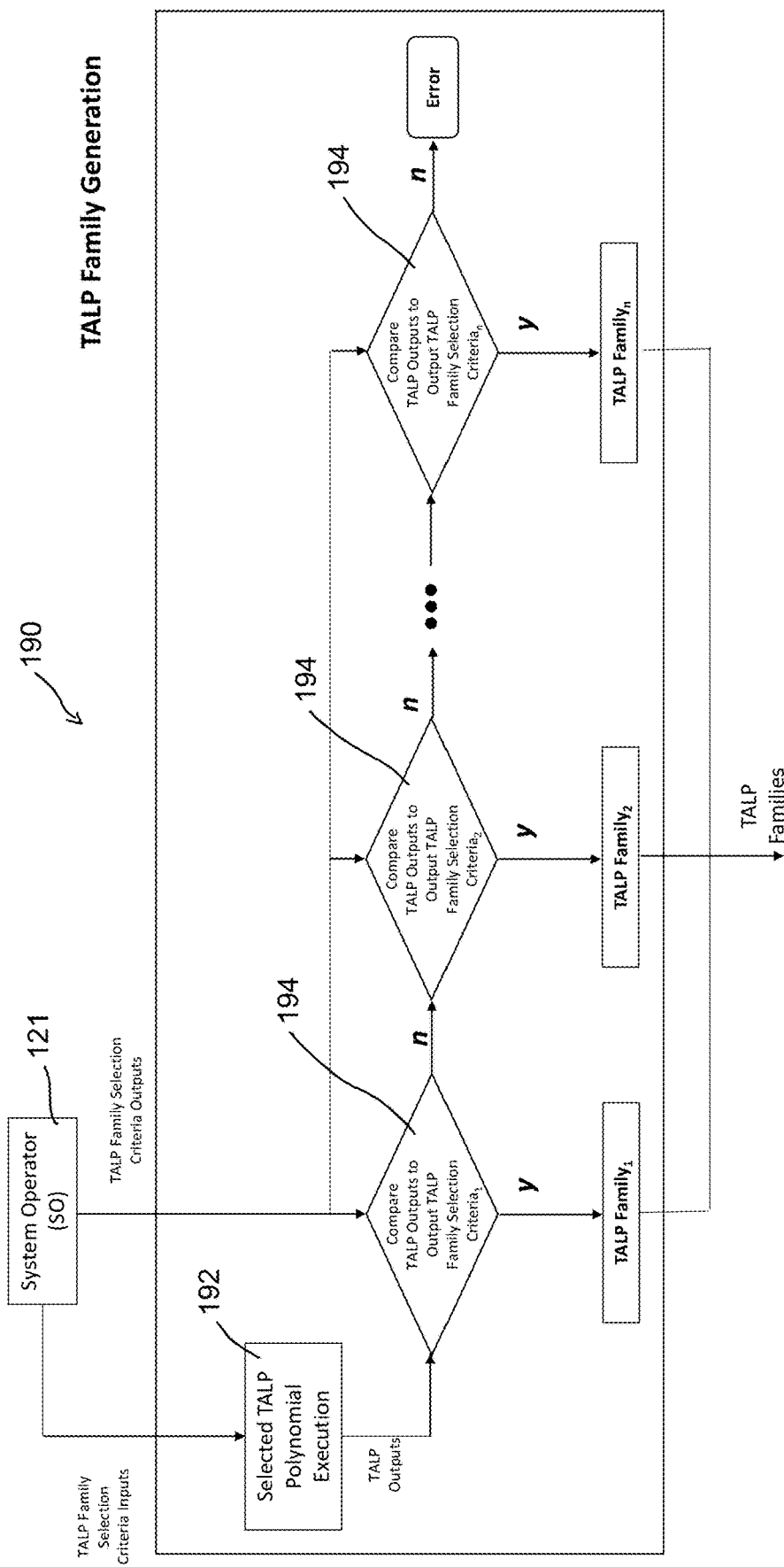
FIG. 6 shows a work flow of the TALP Family Generation component of the MTF E&M system, in accordance with embodiments of the present invention.

FIG. 6 shows a work flow 190 showing TALP Family generation as follows:
1) The system receives TALP Family Selection Criteria from the System Operator 121.
2) Selected TALP Family Selection Criteria Inputs are used in the execution of the selected TALP polynomials, at process 192.
3) The TALP outputs are compared to the TALP Family Selection Criteria outputs (values, timings, memory allocations) for inclusion in the associated TALP Family, at process(es) 194.

Figure 7:
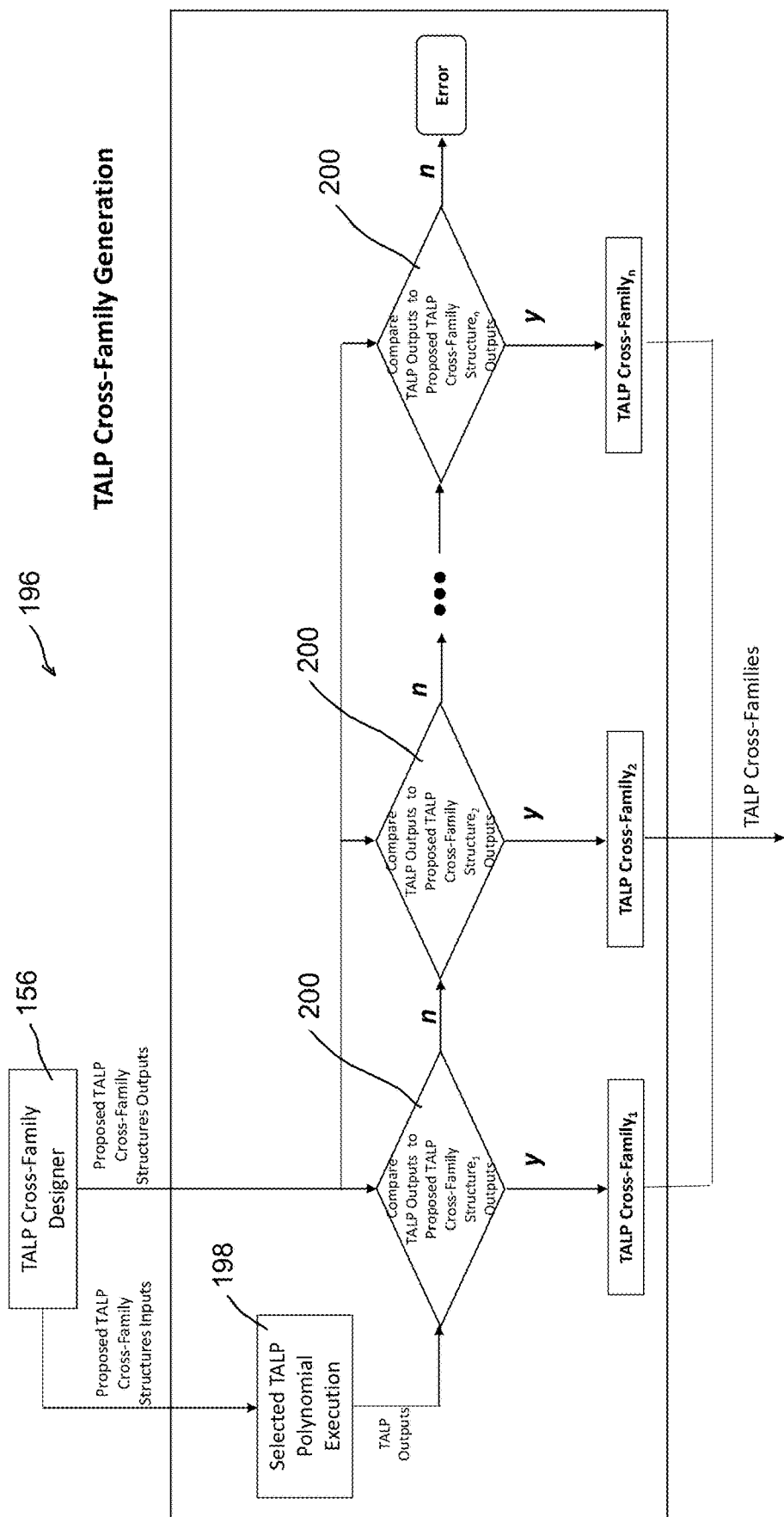
FIG. 7 shows a work flow of the Cross-Family TALP Generation component of the MTF E&M system, in accordance with embodiments of the present invention.

FIG. 7 is a work flow 196 showing the TALP Cross-Family generation as follows:
1) The system receives Proposed TALP Cross-Family Structures from the TALP Cross-Family Designer.
2) Proposed TALP Cross-Family Structure Inputs are used in the execution of the TALP polynomials of the TALPs in families, at process 198.
3) The outputs of the executed TALP polynomial outputs are compared to the Proposed TALP Cross-Family Structure output values (values, timings, memory allocations) for inclusion in the associated TALP Cross-Family, at process(es) 200.

Figure 8:
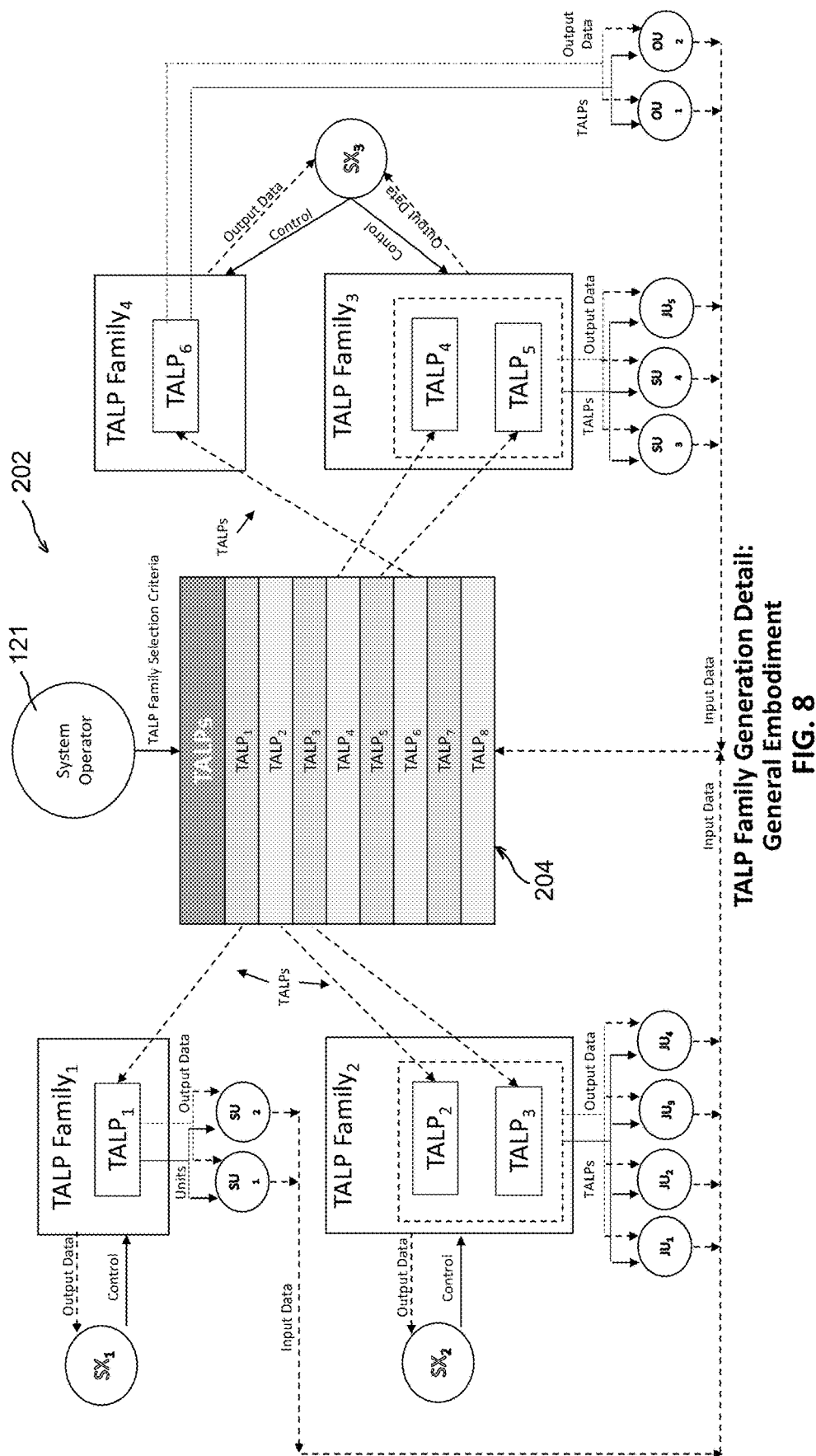
FIG. 8 shows a diagram of the details of generating TALP families, in accordance with embodiments of the present invention.

FIG. 8 is a diagram 202 detailing the grouping of selected TALPs into TALP families 204 as presented in FIG. 6. TALPs in TALP Families can be accessed by various categories of TALP users or used in TALP Cross-Family structures.

Figure 9:
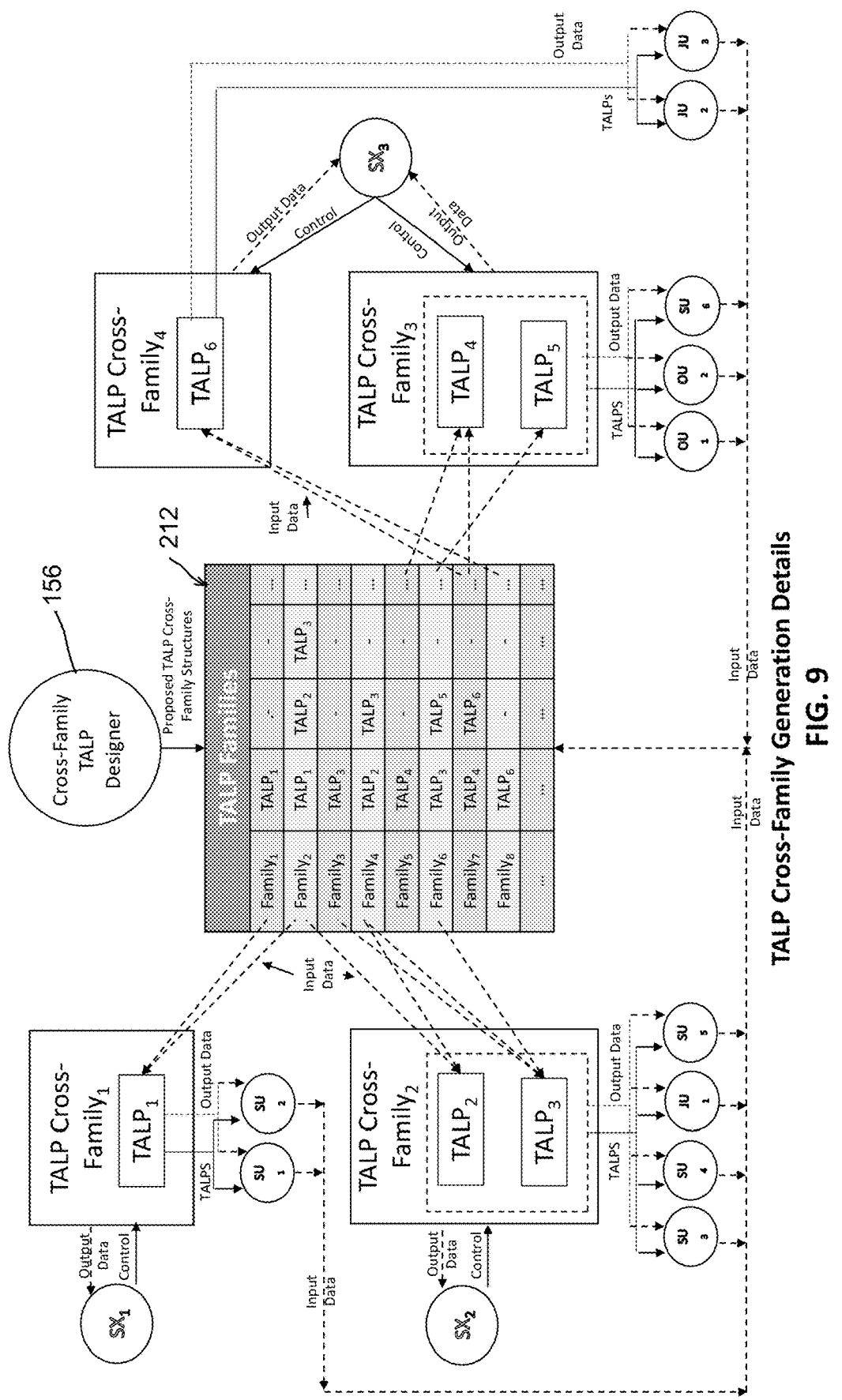
FIG. 9 shows a diagram of the details of generating TALP Cross-Families, in accordance with embodiments of the present invention.

FIG. 9 is a diagram 210 detailing the inclusion of selected TALPs from TALP families into TALP Cross Families 212 as presented in the FIG. 7 description. TALPs within TALP Cross-Families can be accessed by various categories of TALP users.

Figure 10:
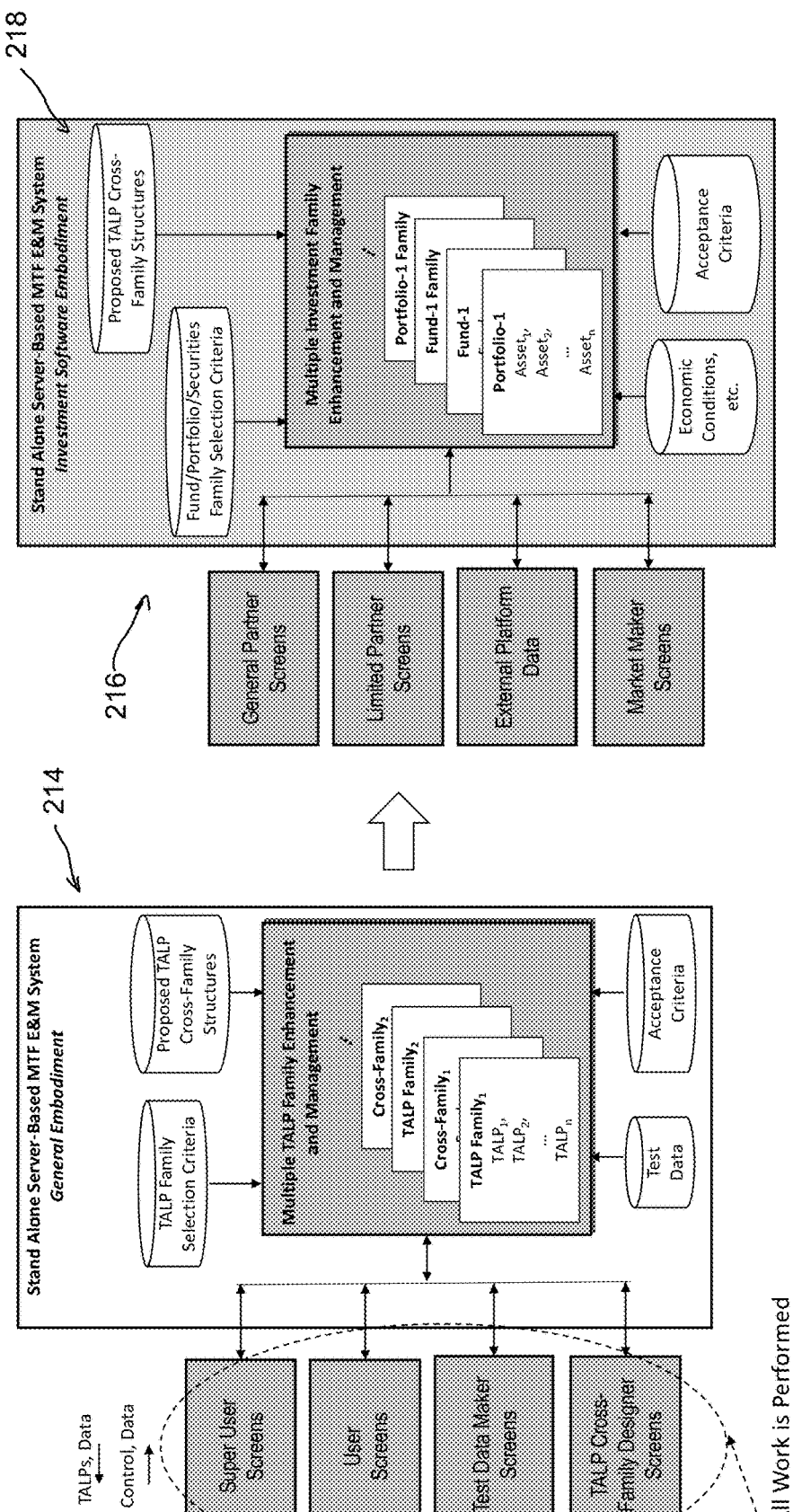
FIG. 10 shows two diagrams: the first depicts an example of a general embodiment of a stand-alone server-based MTF E&M system, and the second depicts an example of an investment software embodiment of a stand-alone server-based MTF E&M system, in accordance with embodiments of the present invention.

FIG. 10 depicts two diagrams. The first diagram 214 shows the MTF E&M system 100 contained within a stand-alone server (mobile device, desktop, laptop, rack-mounted, etc.). The second diagram 216 shows an example of a software system (Investment Management Software) put into MTF E&M form by replacing test data makers, super users, TALP cross-family designers, and users with their analogous data from external platform data, general partners, market makers, and limited partners. The second diagram 216 also shows a system 218 that is contained within a stand-alone server system.

Figure 11:
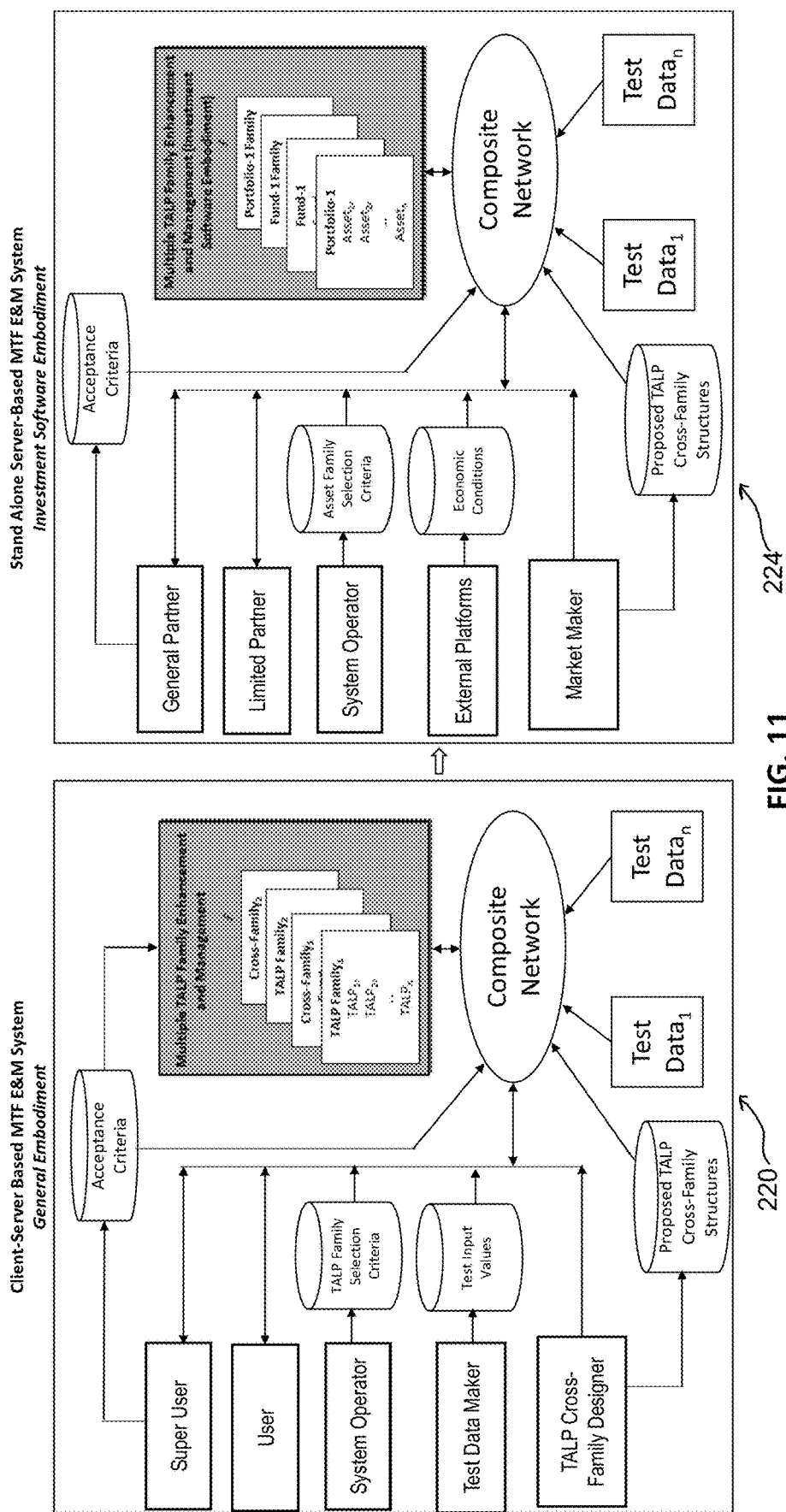
FIG. 11 shows two diagrams: the first depicts an example of a general embodiment of a client-server-based MTF E&M system, and the second depicts an example of an investment software embodiment of a client-server-based MTF E&M, in accordance with embodiments of the present invention.

FIG. 11 depicts two diagrams. The first diagram 220 shows the MTF E & M system accessible using a client-server model. The second diagram 224 shows an example of a software system (Investment Management Software) put into MTF E&M form by replacing test data makers, super users, TALP cross-family designers, and users with their analogous data from external platform data, general partners, market makers, and limited partners. The second diagram 224 also shows a system that is accessible using a Client-Server model.

Figure 12:
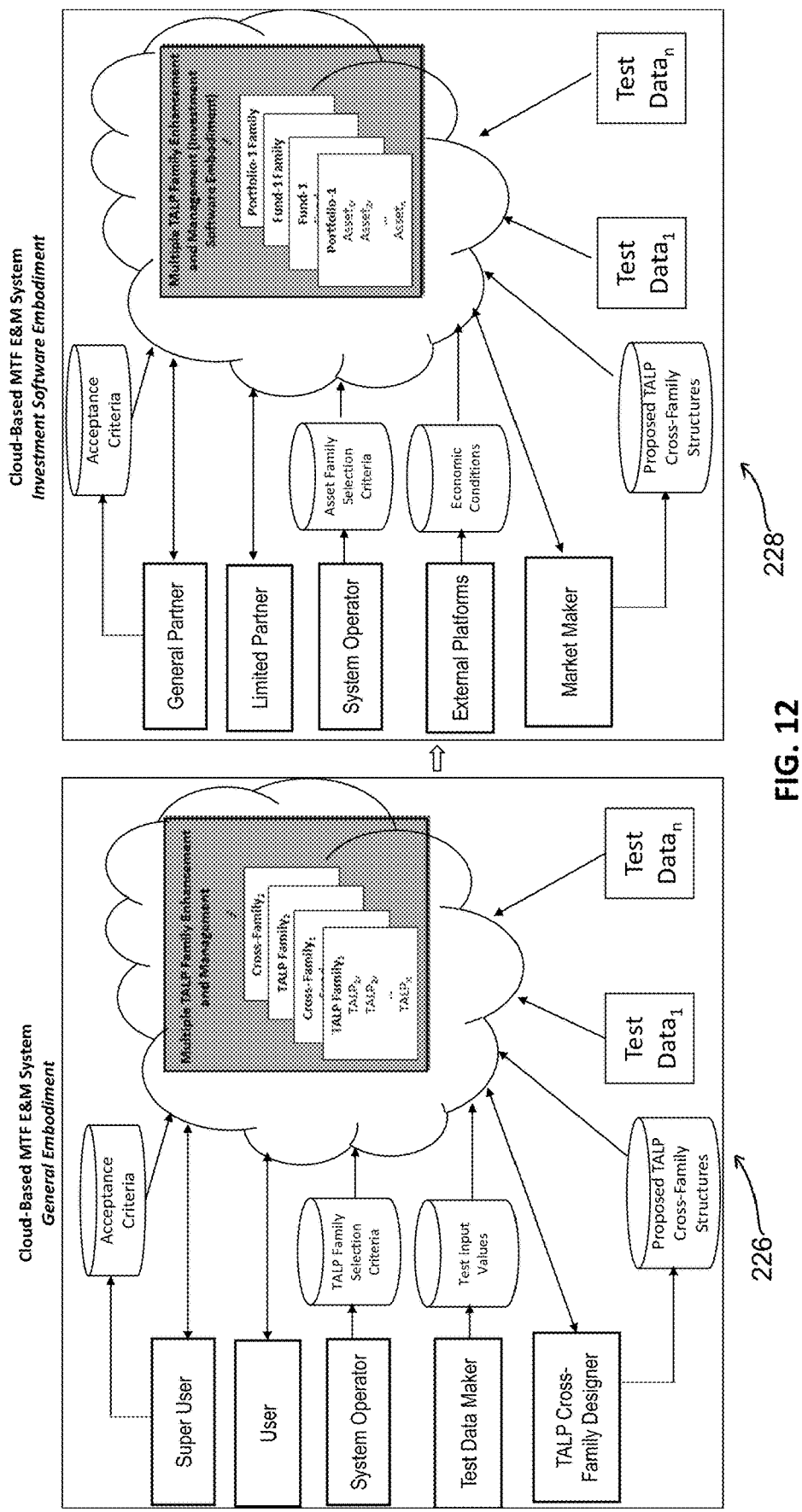
FIG. 12 shows two diagrams: the first depicts an example of a general embodiment cloud-based MTF E&M, and the second depicts an example of an investment software embodiment of a cloud-based MTF E&M system, in accordance with embodiments of the present invention.

FIG. 12 depicts two diagrams. The first diagram 226 shows the MTF E&M system accessible using a cloud-based model. The second diagram 228, which is also accessible using a cloud-based model, shows an example of a software system (Investment Management Software) put into MTF E&M form by replacing test data makers, super users, TALP cross-family designers, and users with their analogous data from external platform data, general partners, market makers, and limited partners.

Figure 13:
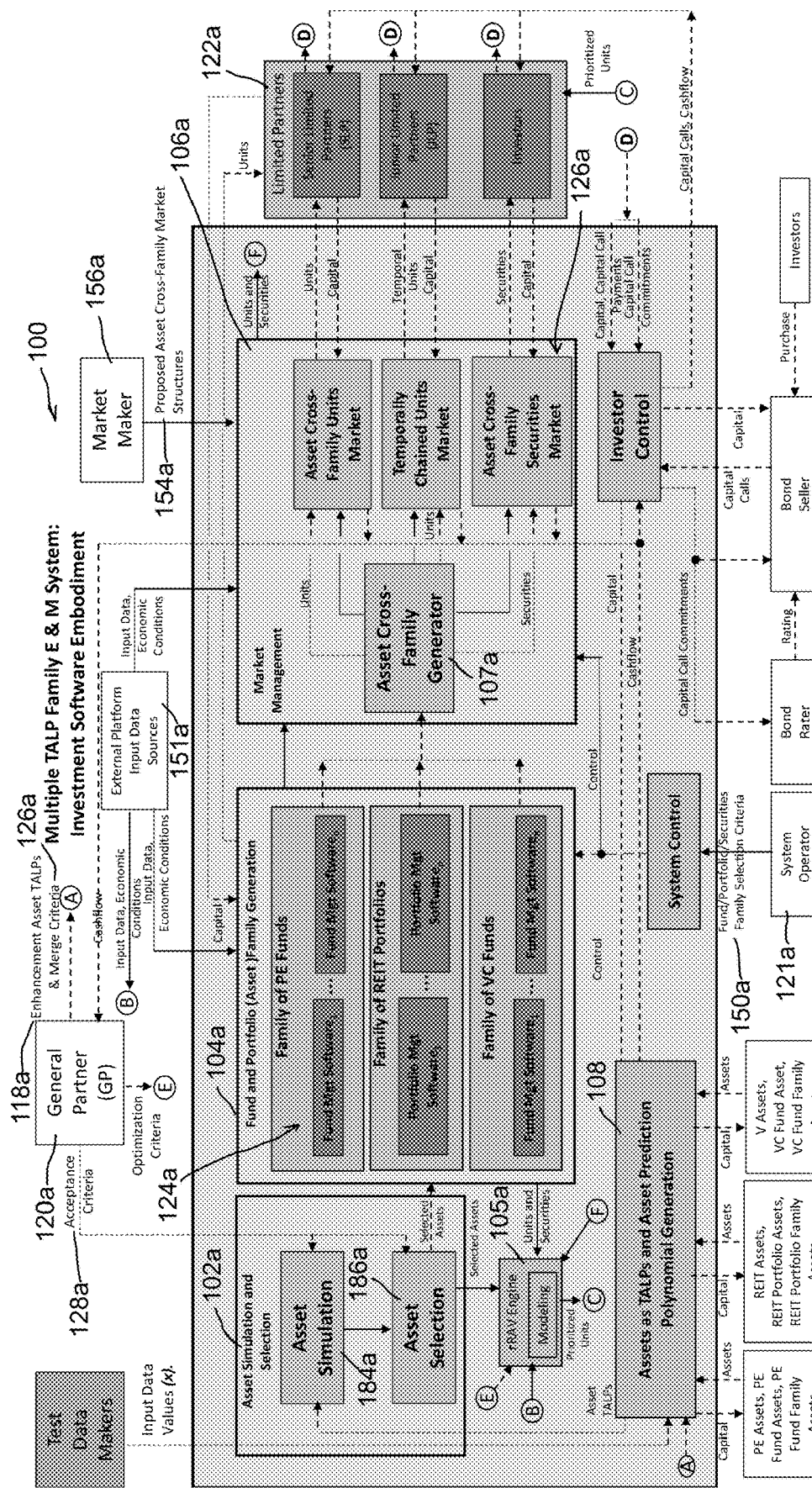
FIG. 13 is a diagram showing an example of a specific investor management software system where datasets, algorithms, and/or software codes are converted into asset TALPs to be modeled and pooled for use by, or distribution to, investors and partners or placed into families and/or cross-families of investment venture funds for use by various classes of investors and partners, in accordance with embodiments of the present invention.

FIG. 13 is a diagram showing an example of a MTF E&M system 100 constructed for investment software, algorithms, or datasets. The MTF E&M system for investment software is composed of four primary components: Asset Simulation and Selection 102a, Fund and Portfolio Family Generation 104a, Market Management 106a, and Assets as TALPs and Asset Prediction Polynomial Generation 108a. Again, the MTF E&M 100 system for investment software, algorithms, or datasets replaces test data makers, super users, TALP cross-family designers, and users with their analogous data from external platform data 151a, general partners 120a, market makers 156a, and limited partners 122a.

This embodiment of the present invention converts asset software codes and asset algorithms into TALP form using the TALP decomposition. Alternatively, detected paired I/O datasets from assets can be converted into the equivalent of TALP form by their transformation into Value Complexity polynomials. These TALPs are herein called asset TALPs.

Associated prediction polynomials for each asset TALP can be generated by executing the asset TALPs using the input values from the external platforms 151a. Asset TALP execution produces a set of input to output data pairs, input to processing time pairs, and input to memory allocation pairs. These paired I/O datasets are placed in the extended source values table shown in FIG. 14 and FIG. 15 and used to generate Value Complexity, Advanced Time Complexity, and Advanced Space Complexity prediction polynomials.

Once an asset TALP with its associated prediction polynomials has been generated, then it is possible for that asset TALP's performance to be enhanced by merging the system-generated asset TALP with another asset TALP called an enhancement asset TALP that originates from the General Partner 120a. Once the asset TALP is generated, regardless of its merge status, it is available for use by, or distribution directly to, an asset TALP user or placement into an Asset TALP Family 124a or Asset TALP Cross-Family 126a.

The asset TALP-associated prediction polynomials are each given a set of input asset acceptance criteria data 128a from the General Partner 120a. This data is used in the execution of the asset TALP-associated prediction polynomials in the system's Asset Simulation 184a. The output values from asset simulation are compared to the output asset acceptance criteria 128a of the General Partners 120a. Any asset TALP whose output values match the output asset acceptance criteria associated with the current input asset acceptance criteria are selected in the system's Asset Selection 186a for further use by the system.

The selected asset TALP's prediction polynomials are each either modeled 105a using input data values from external platforms and made available for use by various partners or executed using sets of input values from the fund/portfolio/securities family selection criteria from the System Operator 121a, giving output values called asset family output values. The asset TALPs whose asset family output values match the output values of the fund/portfolio/securities family selection criteria are added to the matching fund or portfolio family in the system's Fund and Portfolio Family Generation component 104a. The output of these asset TALPs are pooled and made directly available to the various types of partners or modeled, pooled, and discretized then made available to the various types of partners.

The prediction polynomials of the selected asset TALPs in a family are each given sets of input values of the Proposed Asset Cross-Family Market Structures data 154a from the Market Maker 156a, giving output values called herein asset cross-family output values. The asset TALPs whose asset cross-family output values match the output values of the proposed asset cross-family structure data are added to the matching asset cross-family in the system's Market Management component 106a. The outputs of these asset TALPs are also pooled and made directly available to the various types of partners or modeled, pooled, and discretized then made available to the various types of partners.

Decreased financial risks and increased financial returns are generated in families and cross-families of funds or portfolios. Standard investment criteria, such as a fund's underlying venture capital requirements, anticipated risk, native investment units (stocks), and anticipated return on investment, is used as part of the optimization criteria by the rRAV Engine for modeling, allowing for the creation of a set of risk/returns instantiated as a set of Asset TALP-derived investment units called prioritized units.

Prioritized units are associated with a set of funds, portfolios, and any bonds or derivatives that are used to leverage the return on investment or the rate of return of the prioritized units. The current invention also allows multiple prioritized units to be automatically temporally chained together, using the sale proceeds at the maturity of a prior prioritized unit to automatically acquire the assets of another prioritized unit. This allows for automatic reinvesting, as well as cashflow generation, prior to the maturity date of the chain. It is possible to construct multiple types of prioritized units and chained prioritized units, each having its own risk/return values and its own minimum and maximum investment level. Since two of the primary distinguishers for different categories of investors are risk/returns and minimum/maximum values, it is now possible to have different categories of investors.

1) In order to generate assets as TALPs and asset prediction polynomials, the "Asset as TALPs and Asset Prediction Polynomial Generation" component 108 of the MTF E&M: Investment Software Embodiment (MTF E&M: IS) 100 receives Economic Conditions from External Platforms, PE assets, REIT Assets, and VC assets as either paired I/O datasets, algorithms, or software codes from various asset sources. Once an Asset TALP has been generated, its behavior can be enhanced by merging enhancement Asset TALPs 118a, from the General Partner 120a, with the system-generated Asset TALPs.

2) The "Asset Simulation and Selection" component 102a of the MTF E&M:IS system 100 receives the generated Asset TALPs (called Assets) with their associated prediction polynomials and the acceptance criteria (comprised of a set of acceptable input values with associated acceptable output values).
   a. The "Asset Simulation and Selection" component 102a activates its "Asset Simulation" subcomponent 184a using the list of generated Assets with their associated prediction polynomials from the "Assets as TALPs and Asset Prediction Polynomial Generation" component 108 and the acceptable input values of the acceptance criteria from the General Partner 120a. The various asset prediction polynomials are executed using the acceptable input values, generating a set of output values for each asset.
   b. The "Asset Simulation and Selection" component 102a activates its "Asset Selection" subcomponent 186a using these acceptable input values paired with their generated predicted output values from the asset simulation 184a. These predicted output values are compared to the acceptable output values of the acceptance criteria 128a, creating a set of selected assets when the generated predicted output values match the acceptable output values. Selected Asset TALPs are either modeled 105a using actual input data values from external platforms 151a for direct use by limited partners 122a or executed using the input values from the Asset TALP Family Selection criteria 150a for inclusion in Asset TALP Families.

3) The "Asset Family Generation" component 104a of the MTF E&M:IS system 100 receives the selected assets with their associated prediction polynomials from the "Asset Simulation and Selection" component 102a and the Fund/Portfolio/Securities family selection criteria 150a (comprised of a set of Fund/Portfolio/Securities family acceptable input values with associated output values for each asset family type) from the System Operator 121a. The prediction polynomials associated with each selected asset are executed using the acceptable Fund/Portfolio/Securities family input values, generating a set of output values that are compared to the acceptable Fund/Portfolio/Securities family output values, for inclusion into the matching asset family.
   a. After inclusion in an Asset Family, the prediction polynomials of each asset in each Asset Family are executed using input data from external platform input data sources generating a pool of output values made available to Limited Partners Categories.
   b. Alternatively, after inclusion in an Asset Family, the prediction polynomials of each asset in each Asset Family are modeled in the rRAV Engine 105a using input data from external platform input data sources then pooled, discretized and optimized and made available to Limited Partners Categories.

4) The "Asset Cross-Family Generator" component 107a of the MTF E&M:IS system 100 receives the assets with their associated prediction polynomials from the Asset Families of the "Asset Family Generation" component 104a and the Proposed Asset Cross-Family Market Structure 154a (comprised of a set of cross-family acceptable input values with associated output values for each cross-family type) from the Market Maker 156a. The prediction polynomials of each asset in each family are executed using the acceptable cross-family input values, generating a set of output values that are compared to the acceptable cross-family output values, for inclusion into the matching cross-family.
   a. After inclusion in an asset cross-family, the prediction polynomials each Asset in each Asset Cross-Family are executed using input data from external platform input data sources, generating a pool of output values made available to Limited Partners Categories.
   b. Alternatively, after inclusion in an Asset Cross-Family, the prediction polynomials of each asset in each Asset Family are modeled in the rRAV Engine 105a using input data from external platform input data sources then pooled, discretized and optimized and made available to Limited Partners Categories.

Figure 14:
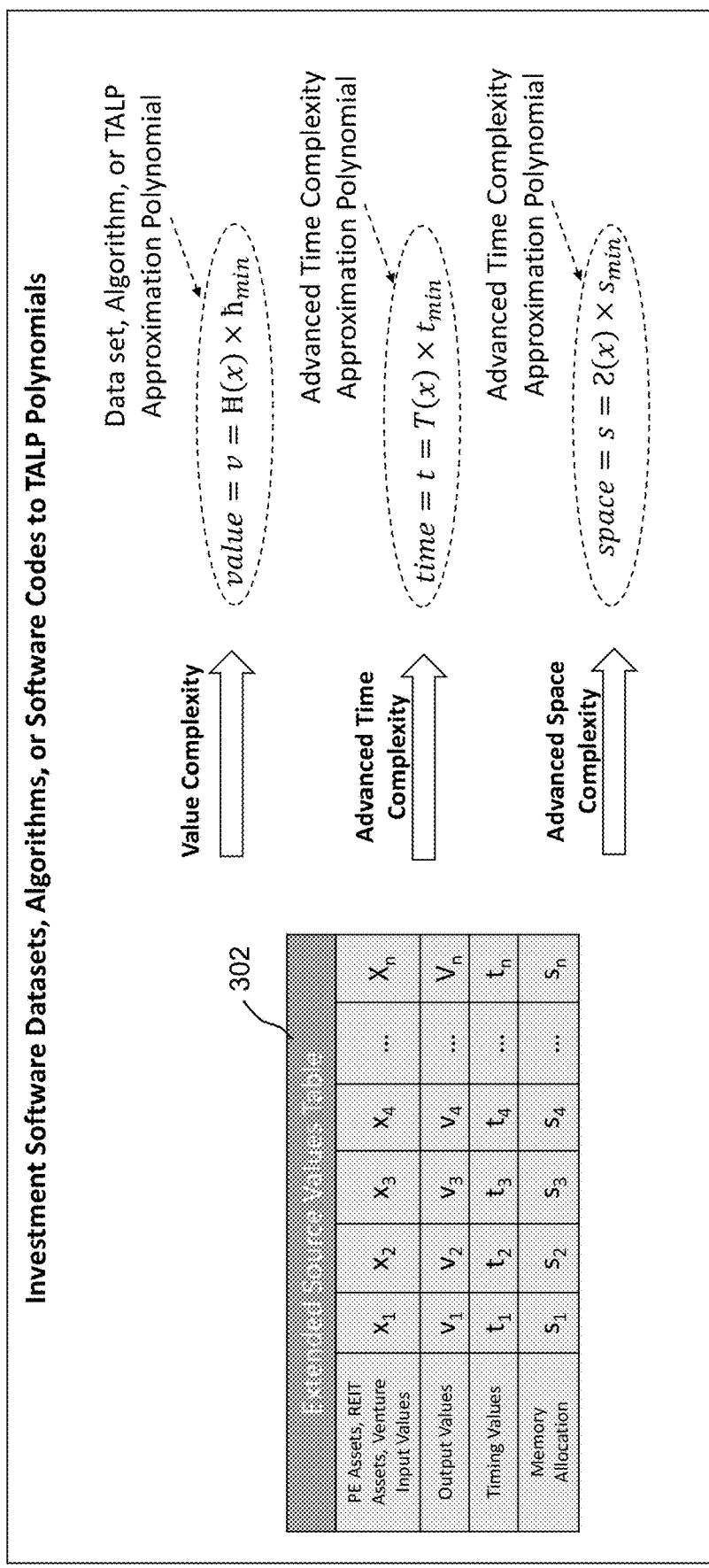
FIG. 14 is a diagram showing an input variable attribute vector (from investment software), an associated output variable attribute vector, an associated timing vector, and associated memory allocation vector converted into predictive polynomials for Value Complexity, Advanced Time Complexity, and Advanced Space Complexity, in accordance with embodiments of the present invention.

FIG. 14 is a diagram 300 showing the creation of an extended source values table 302 from PE/REIT/Venture assets treated as TALPs. The sets of monotonic input values of the PE/REIT/Venture assets as TALPs form an input variable attribute vector ($x_1$ through $x_n$) while the sets of associated output values form an output variable attribute vector ($v_1$ through $v_n$). The completion time for the associated input to output transformation of PE/REIT/Venture assets form the timing variable attribute vector ($t_1$ through $t_n$), and an associated memory allocation required to process and store values that are transformed by PE/REIT/Venture assets form the memory allocation variable attribute vector ($s_1$ through $s_n$). These vectors are shown combined into the extended source values table 302.

The vectors are accessed pairwise: Input values and output values, input values and timing values, input values and memory allocation. These pairs are used to generate, respectively: Value Complexity, Advanced Time Complexity, and Advanced Space Complexity. The predicted processing time of the current asset can be generated for any valid set of input values so long as the input value is greater than the minimum value used to create the Advanced Time Complexity polynomial. The predicted required memory allocation needed to process the current asset can be generated for any valid set of input values so long as the input value is greater than the minimum value used to create the Advanced Space Complexity polynomial.

FIG. 15 is a diagram 304 showing that multiple assets of a family or cross-family can be processed simultaneously using their associated prediction polynomials. An array of input values is constructed and used to generate either an array of output values from Value Complexity I 306 or a single pooled value from Value Complexity II 308. The input variable attribute array is also used to generate an Advanced Time Complexity value 310 via the use of an Advanced Time Complexity polynomial and an Advanced Space Complexity value 312 via the use of an Advanced Space Complexity polynomial.

Figure 16:
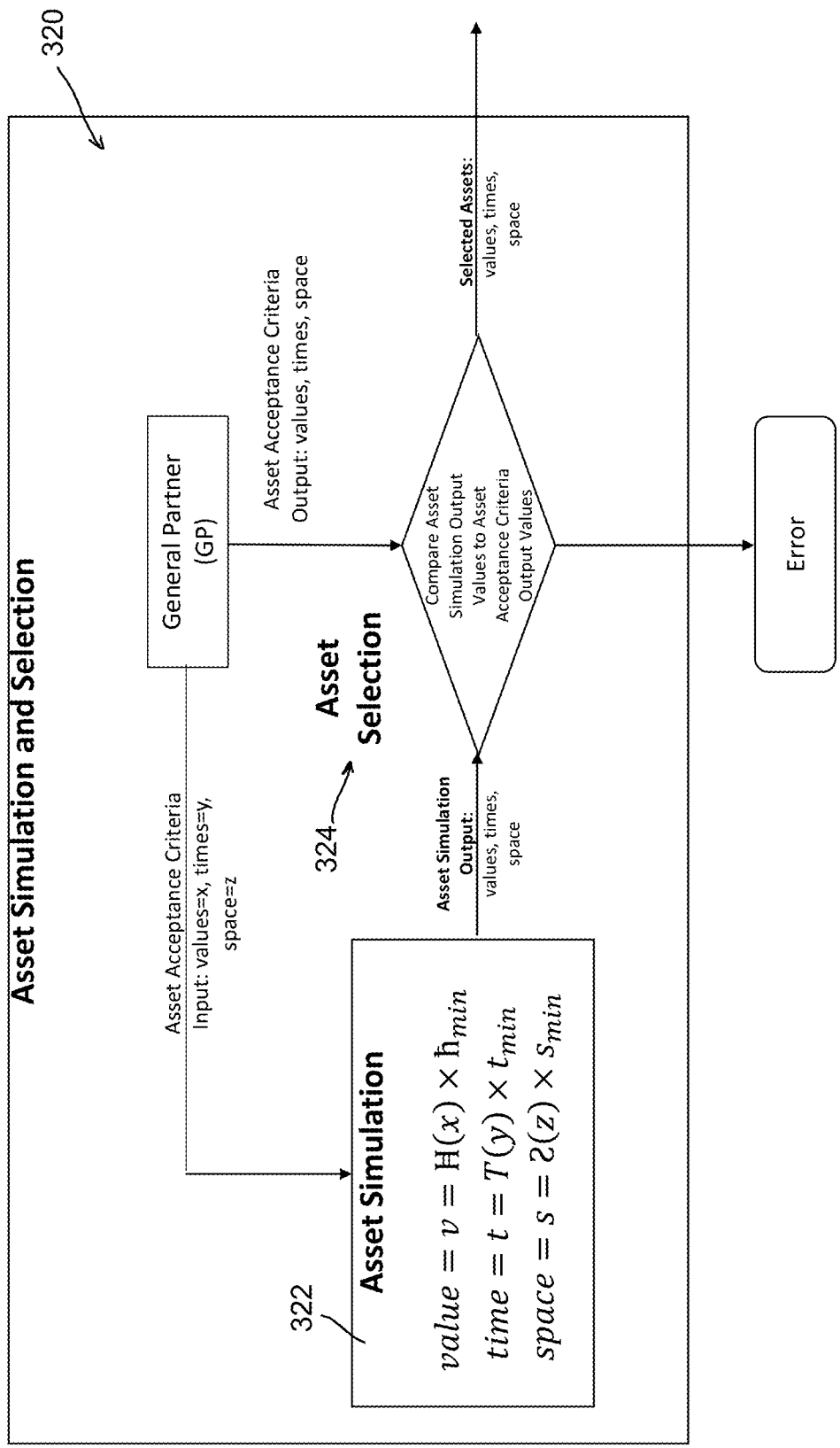
FIG. 16 shows a work flow of the Asset Simulation and Selection component of the MTF E&M system, the Investment Software Embodiment of FIG. 13.

FIG. 16 shows a more detailed diagram of Investment Asset polynomials (treated as TALPs) 320 used in asset simulation and asset selection. Asset Simulation and Asset Selection is performed as follows:

Asset Simulation 322
1) The system receives Asset Acceptance Criteria input values, times, and memory allocation from the General Partner.
2) The Asset polynomials (treated as TALPs) are executed using the received Asset Acceptance Criteria values.
3) The output values from the executed Asset polynomials are saved for selection comparison.

Asset Selection 324
1) The system receives Asset Acceptance Criteria output values, timings, and memory allocation from the General Partner.
2) The Asset polynomial's saved output data (values, timing, and memory allocation) from the simulation is compared to the received Asset Acceptance Criteria output values, timings, and memory allocation.
3) The Asset polynomials whose saved simulation output values match the received Asset Acceptance Criteria output values are selected for use in a fund or portfolio.

Figure 17:
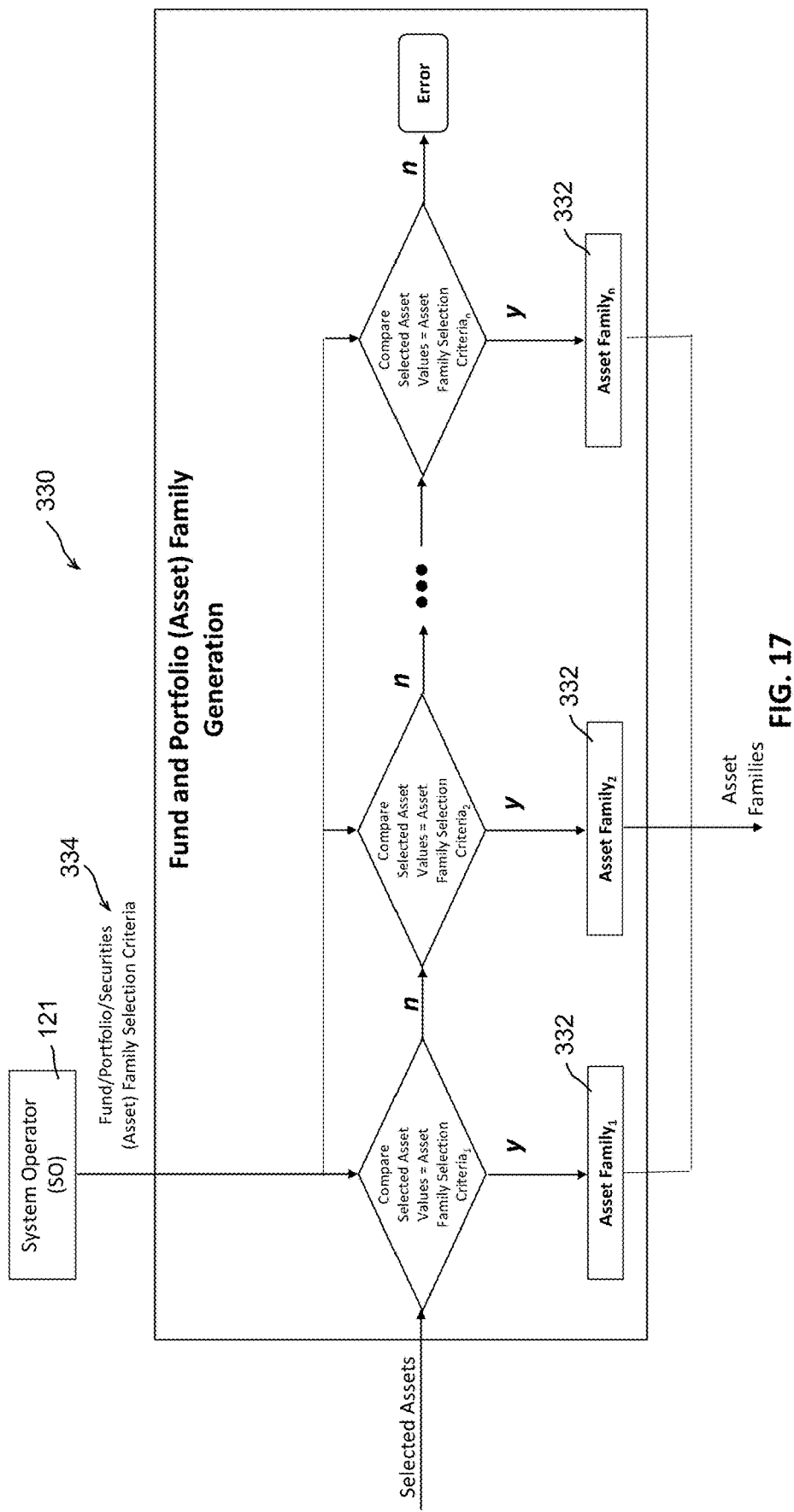
FIG. 17 shows a work flow of the Fund (Asset) Family generation component of the MTF E&M system, the Investment Software Embodiment of FIG. 13.

FIG. 17 shows a detailed diagram 330 using selected asset polynomial output values in the selection of assets for inclusion in an Asset Family 332 when such values are compared against the Asset Family Selection Criteria 334 from the System Operator 121.
1) The system receives the Asset Family Selection Criteria from the System Operator.
2) Selected Asset Family Selection Criteria inputs are used in the execution of the selected Asset polynomials.
3) The output values from the execution of the asset polynomials are compared to the Asset Family Selection Criteria outputs (values, timings, memory allocations) for inclusion in the associated Asset Family.

Figure 18:
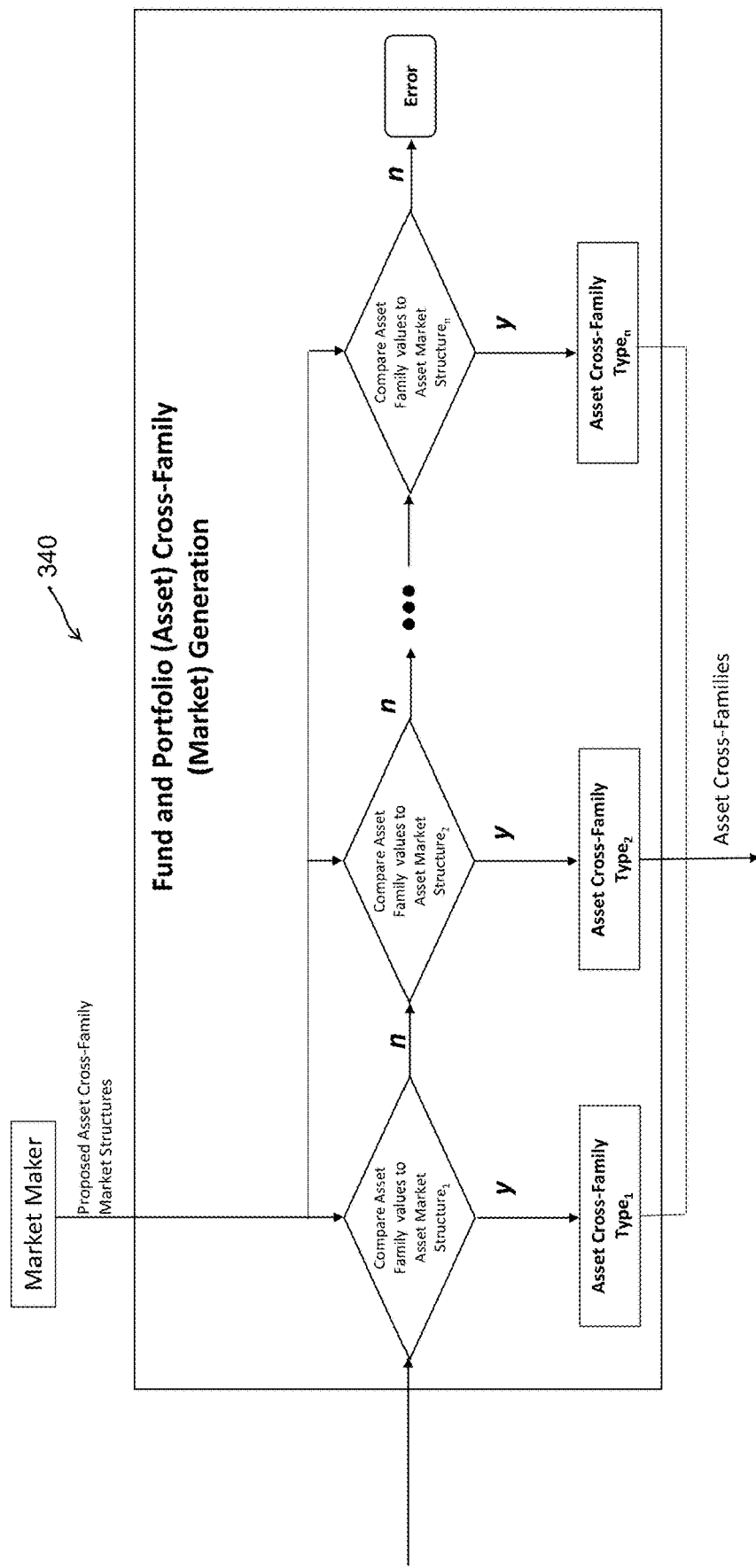
FIG. 18 shows a work flow of the Asset Cross-Family generation component of the MTF E&M system, the Investment Software Embodiment of FIG. 13.

FIG. 18 is a diagram 340 showing the details of Asset Cross-Family generation from FIG. 13 as follows:
1) The system receives Proposed Asset Market Structures from the Market Maker.
2) Proposed Asset Market Structure Inputs are used in the execution of the Asset polynomials of Assets that are within families.
3) The outputs of the executed Asset polynomial outputs are compared to the Proposed Market Structure output values (values, timings, memory allocations) for inclusion in the associated Asset Cross-Family.

Figure 19:
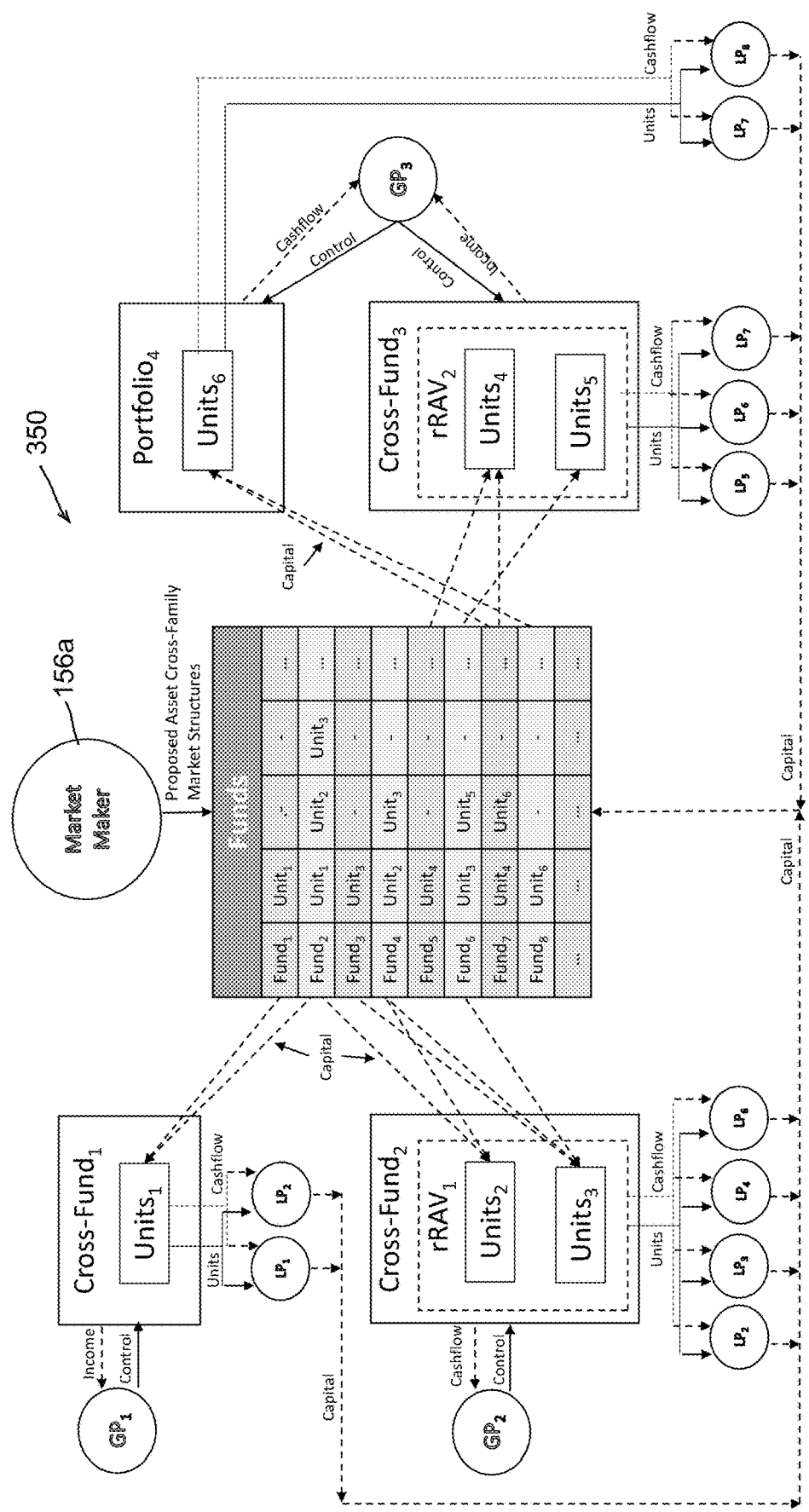
FIG. 19 shows a diagram of the details of Asset Cross-Family generation, the Investment Software Embodiment of FIG. 13.

FIG. 19 is a diagram 350 detailing the inclusion of selected Asset Family assets into Asset Cross-Families as presented in the FIG. 18 discussion. Assets within Asset Cross-Families can be accessed by various categories of partners.

Figure 20:
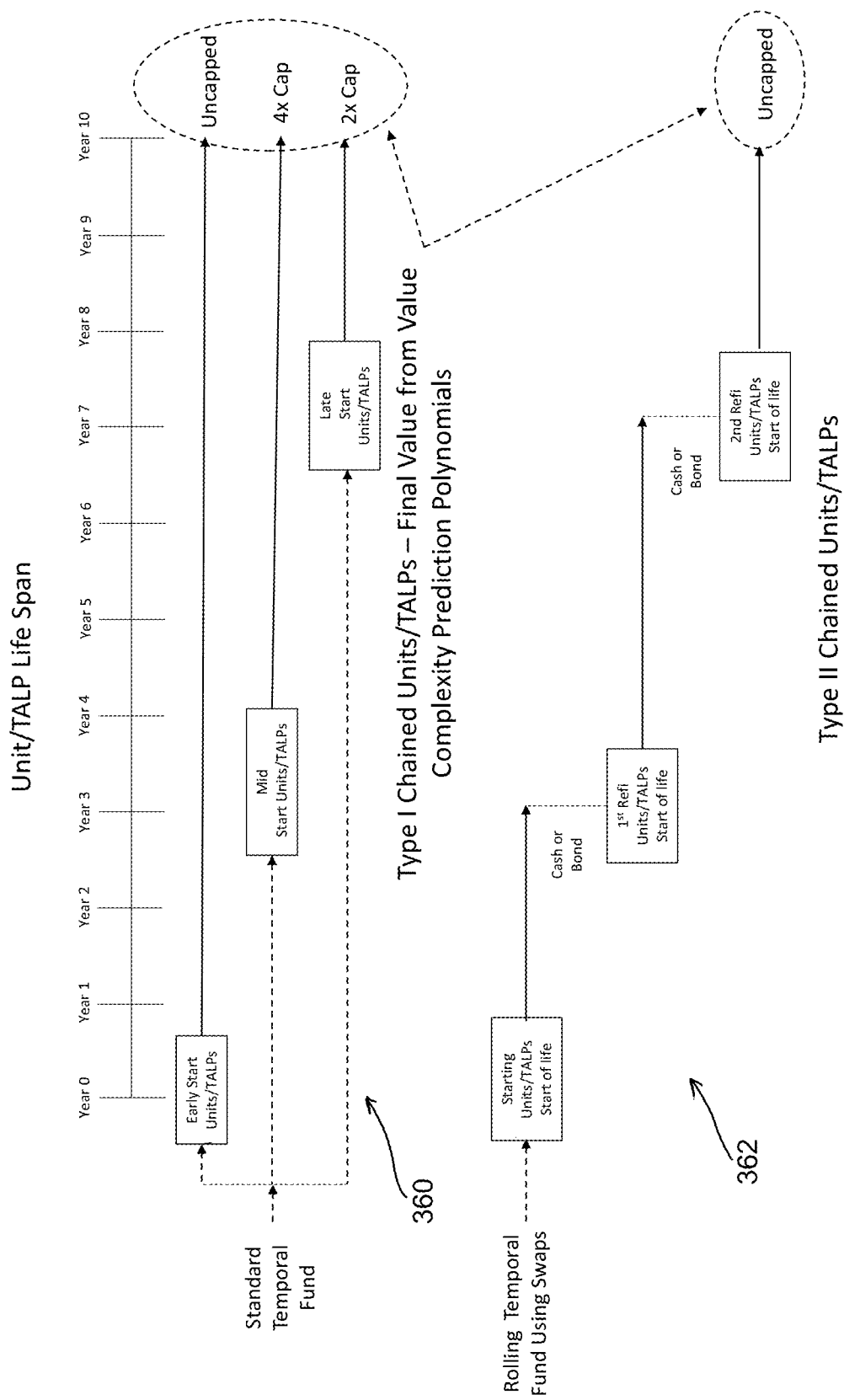
FIG. 20 shows two diagrams: the first depicts type I chained TALPs or alternatively, type I chained investment units, and the second depicts type II chained TALPs or, alternatively, type II chained investment units, in accordance with embodiments of the present invention. The chained TALPs and/or chained investment units all end at the same time.

FIG. 20 shows a diagram with two graphs. The first graph 360 shows the use of advanced time complexity to determine when the execution of a group of type I chained TALPs, each with different starting times, will complete. Using the Value Complexity polynomial allows the output values of the TALPs to be known for any given time period. The TALPs are chained together in such that regardless of the TALP starting times, all of their ending times are linked. If the TALPs represent investment units then the output values could be cash flows. In order to ensure that all units complete at the same time, the associated Advanced Time Complexity polynomial is used. To understand how much time needs to be added or subtracted from the chain of linked units requires the use of the associated Advanced Speedup polynomial on an array comprised of all chained assets associated with the chained units. Consider that how much memory to allocate for the units is directly proportional to the number of units currently activated. If at some point in time the number of predicted active units is not what is expected, this indicates a problem with the chain of units. To chained unit problems requires the use of both Advanced Time Complexity and Freeup prediction. It should be noted that Freeup prediction requires the use of Advanced Space Complexity.

The second graph 362 shows the use of linked units combined with Value Complexity polynomials to determine the output of the type II chain of linked units at any given time period. The linkage of software codes (for example investment units converted to TALP form) allows for the prediction of software output values (for example cash flow values). As with the first graph, chained unit error prediction requires the use of Advanced Time Complexity, Advanced Space Complexity, and Freeup.

Figure 21:
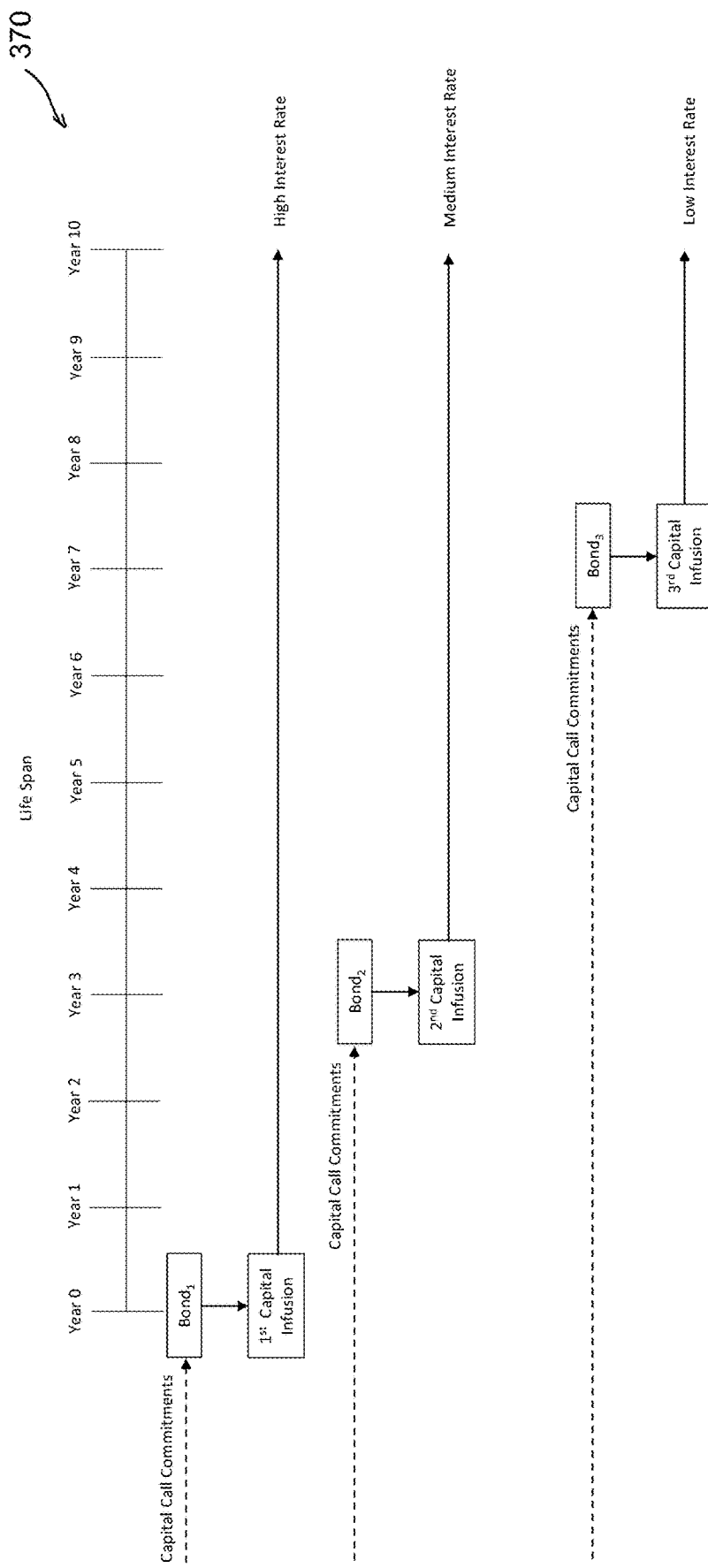
FIG. 21 shows a diagram depicting three type III chained TALPs or alternatively, type III chained investment units, in accordance with embodiments of the present invention. Each type III chained TALP or type III chained investment unit starts at a different time, but all chains end at the same time.

FIG. 21 shows a graph 370 of three unit type III chains (from bond analysis software linked with investment unit software). Each linked unit chain completes execution at the same time. In a sense, Type III chained units function like a combination of Type I and Type II unit chains but with bonds converted into algorithmic form. As shown for FIG. 20, chained unit error prediction requires the use of Advanced Time Complexity, Advanced Space Complexity, and Freeup.

Figure 22:
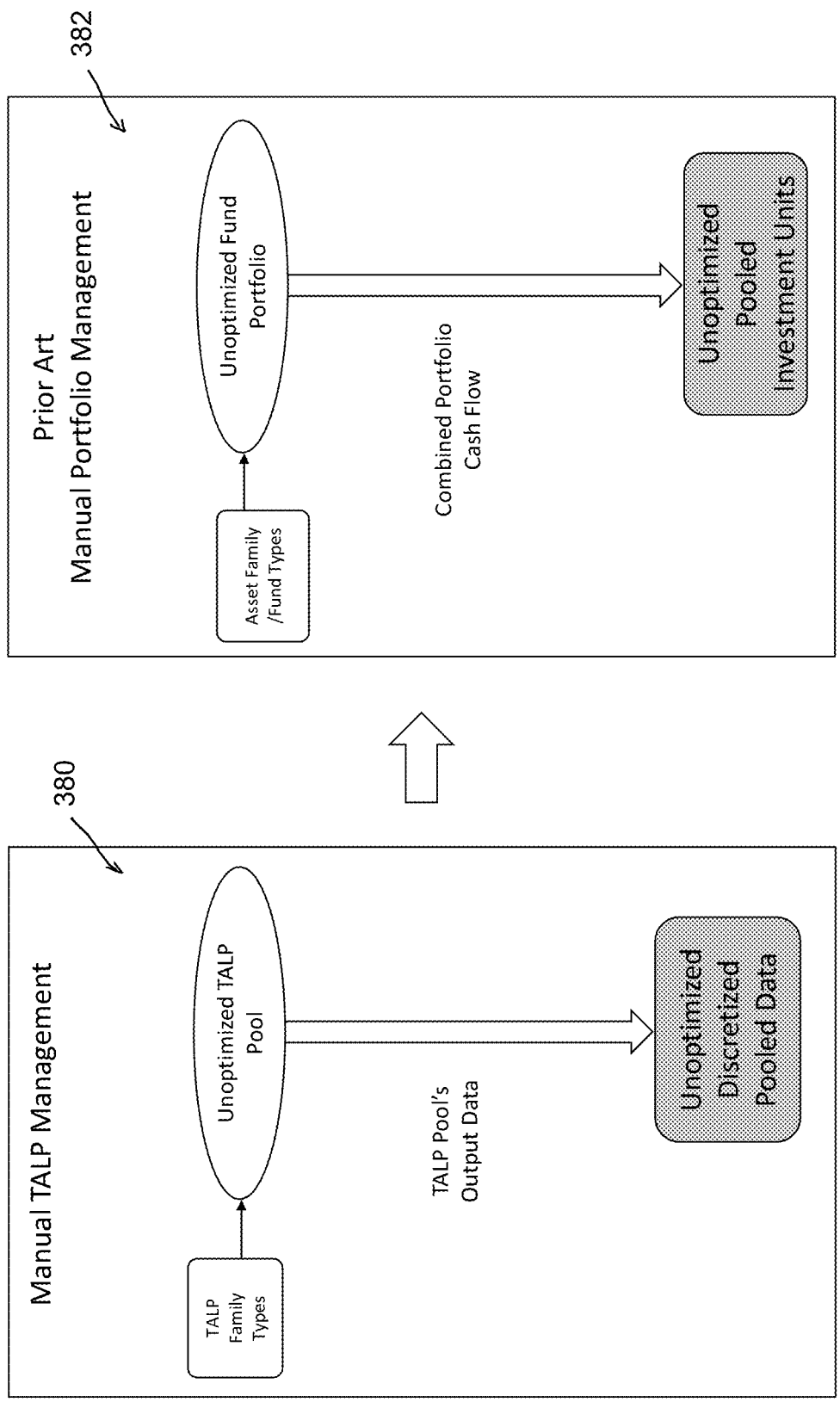
FIG. 22 shows two diagrams: the first depicts an example of an unoptimized set of pooled TALPs from a family or cross-family whose combined output data is discretized for later use, and the second diagram shows the same example using an unoptimized set of pooled investment fund algorithms whose outputs are cash flows that are discretized for later use, in accordance with embodiments of the present invention.

FIG. 22 shows two diagrams. The first diagram 380 shows a set of TALP Families used to generate a pooled but unoptimized output dataset. This pooled output dataset is then discretized. The unoptimized, discretized pooled data can now be made available to different user categories. The second diagram 382 shows the same diagram using a set of funds used to generate a pooled but unoptimized output data. The unoptimized, pooled data is then discretized for use by different partner categories (general, senior limited, junior limited, etc.)

Figure 23:
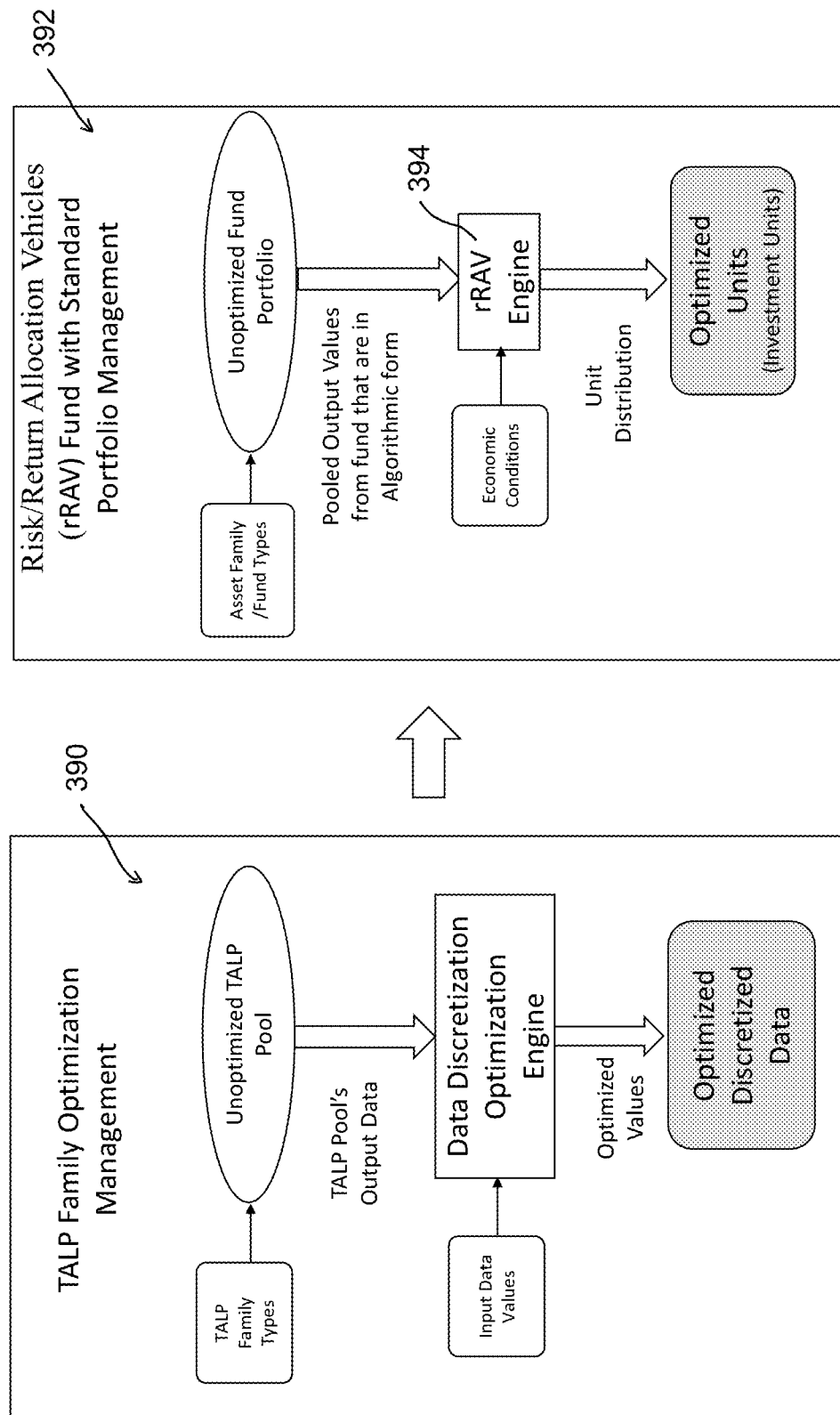
FIG. 23 shows two diagrams: the first depicts an example of an unoptimized set of pooled TALPs from a family or cross-family whose combined outputs are first discretized and then optimized for later use, and the second diagram shows the same example using unoptimized pooled investment fund algorithms whose cash flow outputs are combined, discretized then optimized for later use, in accordance with embodiments of the present invention.

FIG. 23 shows two diagrams. The first diagram 390 shows a set of TALP Families used to generate a pooled, but unoptimized output dataset that is then sent to the Data Discretization Optimization engine. This engine breaks up the pooled dataset, using input dataset values, into groups that are optimized to minimize some values and maximize other values. The optimized discretized data is then ready for distribution to different categories of users (super user, senior, junior, etc.).

The second diagram 392 shows a set of asset Families used to generate a pooled unoptimized investment fund output dataset (returns, risk, interest rates, etc.) that is then sent to the rRAV engine 394. This engine breaks up the pooled dataset, using economic conditions, into groups that are optimized to minimize some values and maximize other values. The optimized discretized pooled data is then ready for distribution to different categories of partners (general partner, senior limited partner, junior limited partner, etc.). The rRAV engine 394 is used by both the Fund and Portfolio Generation and the Market Management components as shown in FIG. 13.

Figure 24:
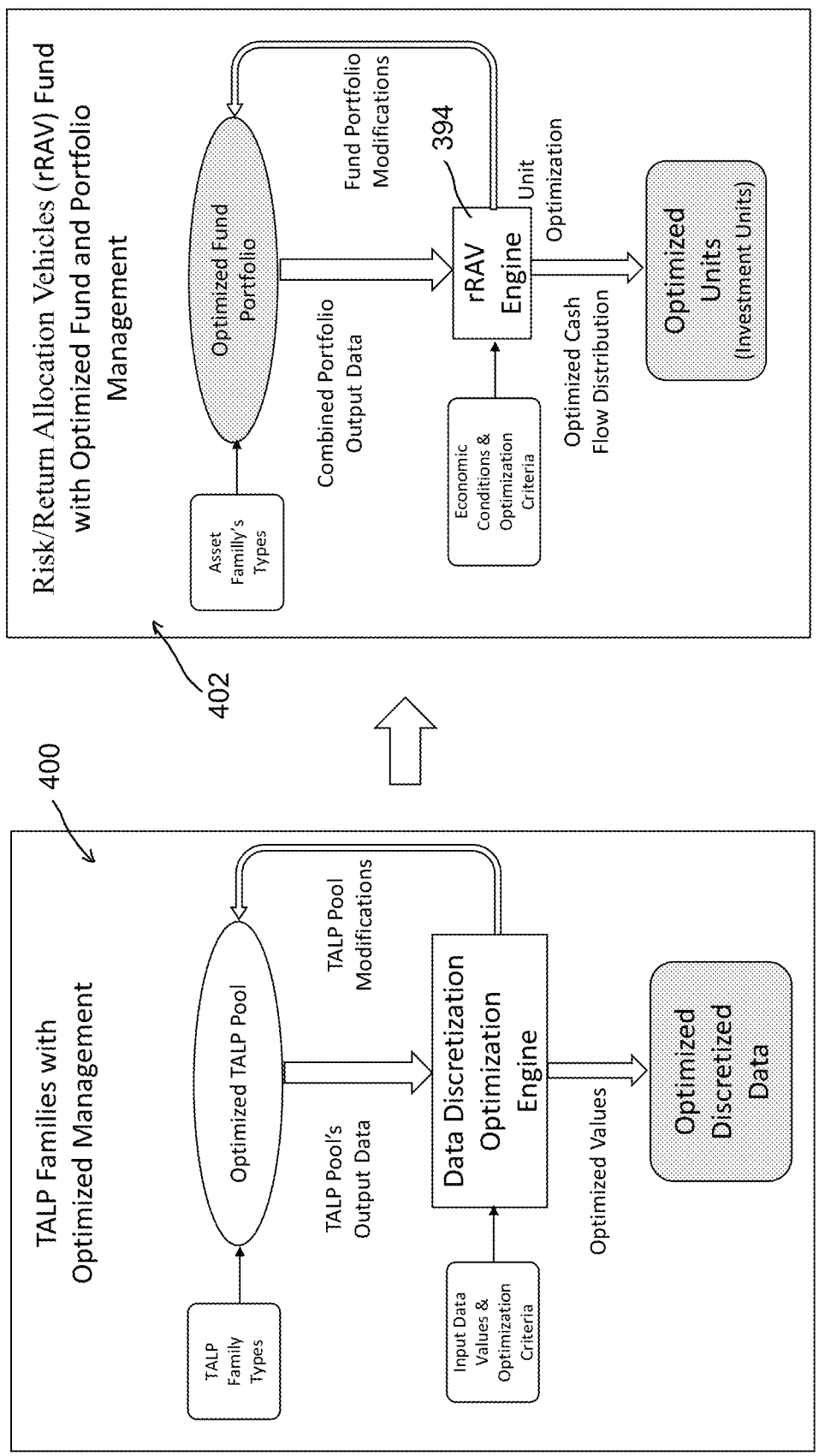
FIG. 24 shows two diagrams. The first depicts an example of a set of optimized pooled TALPs from a family or cross-family whose outputs are discretized then further optimized (using optimization criteria), using the data discretization optimization engine. The second diagram shows the same example only using optimized pooled investment fund algorithms whose cash flow outputs are discretized then further optimized for later use, in accordance with embodiments of the present invention.

FIG. 24 shows two diagrams. The first diagram 400 shows a TALP Family's pooled, optimized output data re-sent to the Data Discretization Optimization engine. The TALP's pooled output data is re-optimized based on new input data values by comparing the TALP output values to the required output values, eliminating any TALP whose output values decrease values that are to be maximized or increase those values that are to be minimized until either the minimum number of TALP Family types are present and/or the best-valued TALPs are included. The continuously optimized discretized data groups are available for distribution to different categories of users (super user, senior, junior, etc.)

The second diagram 402 shows an Asset Family's pooled, optimized output data sent to the Risk/Return Allocation Vehicle (rRAV) engine 394. The Asset Family's pooled output data is re-optimized based on new input data values by comparing the Asset output values to the required output values, eliminating any Asset whose output values decrease values that are to be maximized or increase those values that are to be minimized until either the minimum number of Asset Family types are present and/or the best-valued Assets are included. The pooled output data is composed of investment units or securities (see FIG. 13). Some units or securities maximize certain output values such as returns while others minimize output values like risk. The continuously optimized units are available for distribution to different categories of partners (general partner, senior limited partner, junior limited partner, etc.).

Figure 25:
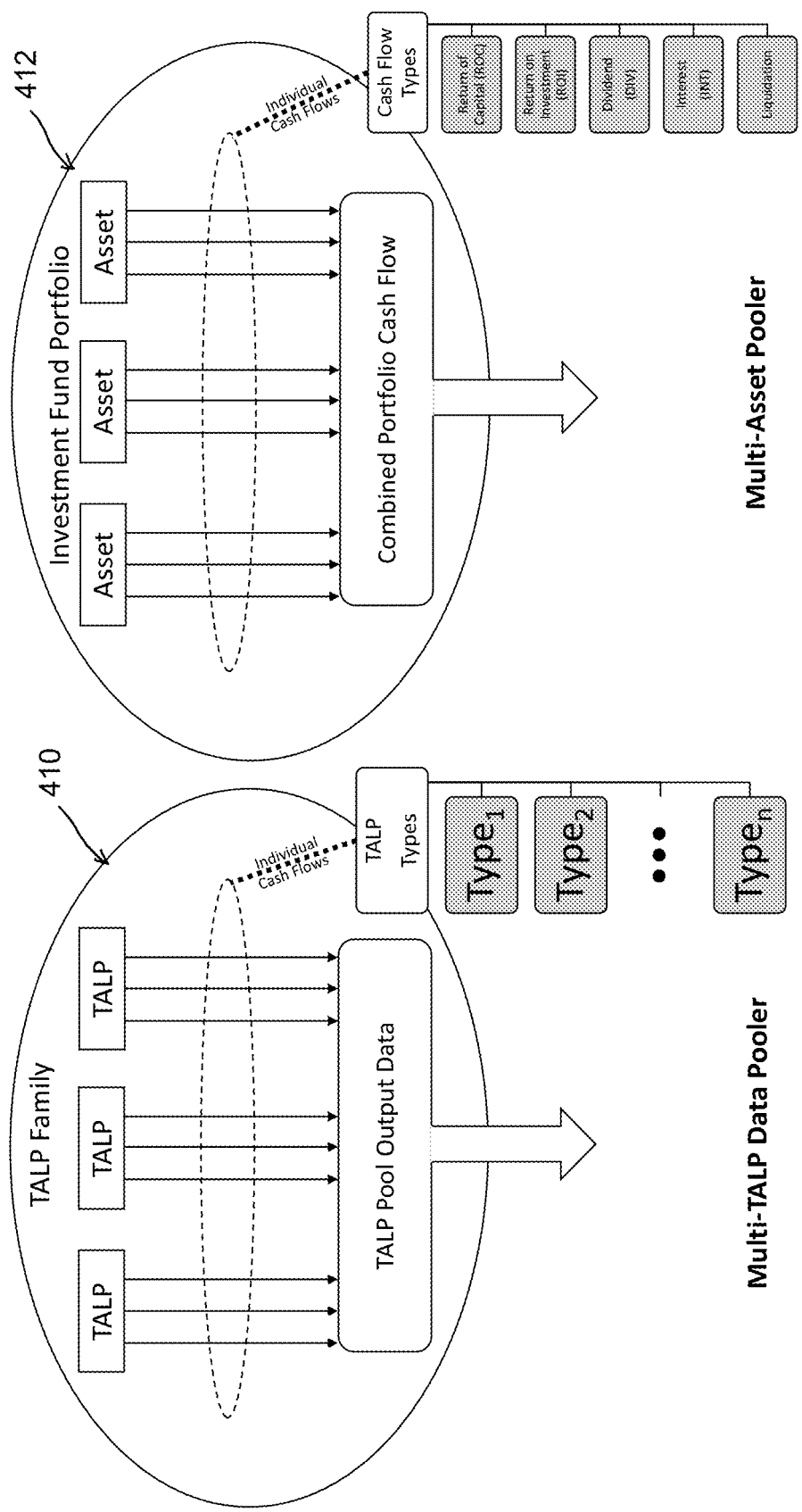
FIG. 25 shows two diagrams: the first depicts an example of various TALP and TALP types within a TALP Family with their output data combined into a single pool of data, and the second diagram shows the same example only using investment fund algorithms within an Asset Family whose output values are pooled, in accordance with embodiments of the present invention.

FIG. 25 shows two diagrams. The first diagram 410 shows the outputs of each TALP within a TALP Family pooled according to the TALP type. The second diagram 412 shows this pooling using the outputs of each asset of an investment fund or portfolio. The output of all assets in a fund are pooled using information from the various asset types within the fund or portfolio.

Figure 26:
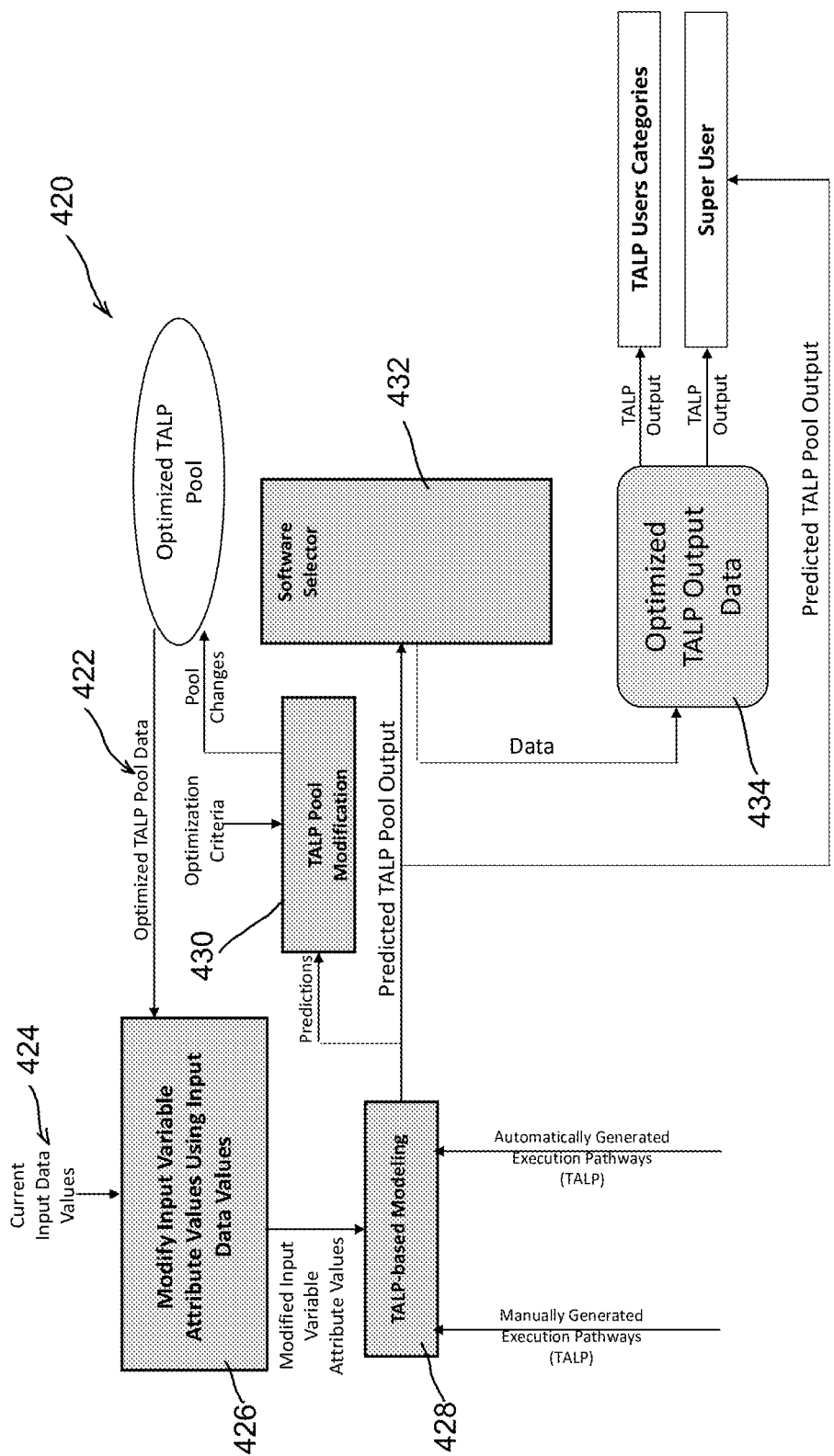
FIG. 26 shows a diagram of the Data Discretization Optimization (DDO) engine that uses the optimized pooled TALP output data generated from the associated TALP prediction polynomials from a family or cross-family, in accordance with embodiments of the present invention.

FIG. 26 shows a diagram 420 of a detailed example of a Data Discretization Optimization (DDO) engine. Optimized TALP pool data 422 and the current input data values 424 are received by the Modify Input Variable Attribute Values Using Input Data Values software component 426. This data uses the TALP polynomials with their associated prediction polynomials to predict future TALP pool values in the TALP-based Modeling software component 428. These predicted output values are compared to the optimization criteria in the TALP Pool Modification software component 430 to determine if the TALPs are applicable in the future. The predicted TALP values are also used to select software that are in algorithmic form in the Software Selector component 432 then sent to the Optimized TALP Output Data component 434 for further use.

Figure 27:
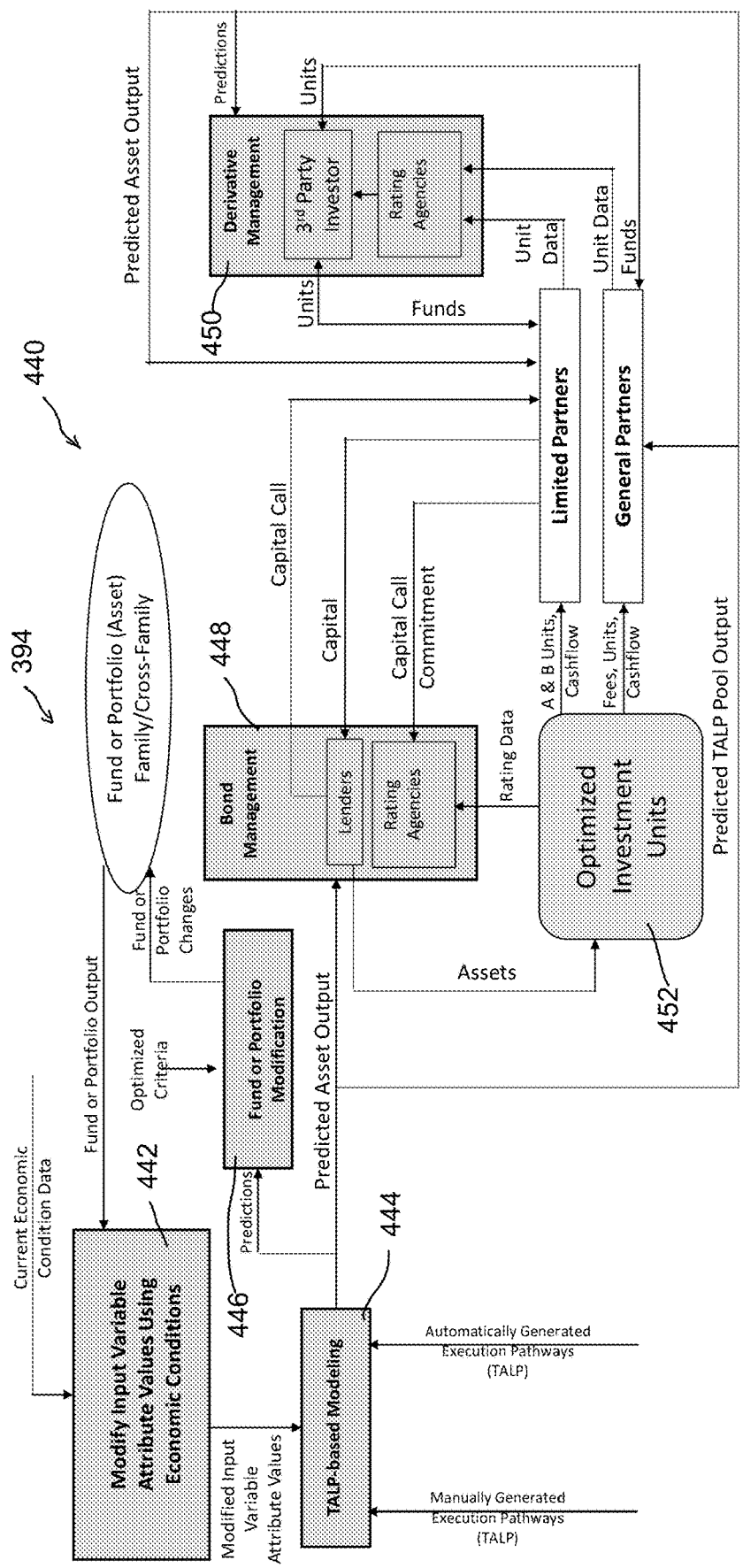
FIG. 27 shows a diagram of a Risk/Return Allocation Vehicle (rRAV) Engine that uses optimized pooled Fund Portfolio (Asset Family) output data generated from investment algorithm prediction polynomials, in accordance with embodiments of the present invention.

FIG. 27 shows a diagram 440 of a detailed example of a risk/Return Allocation Vehicle (rRAV) engine 394. Optimized Fund or portfolio pooled data and the current economic conditions are received by the Modify Input Variable Attribute Values Using Economic Conditions software component 442. This data uses the TALP polynomials, with associated prediction polynomials created for the Fund assets to predict future fund or portfolio values in the TALP-based Modeling software component 444. These predicted values are compared to the optimization criteria in the Fund or Portfolio Modification Software component 446 to determine if Fund or Portfolio asset values are applicable in the future. Unlike the DDO engine shown in FIG. 26, the rRAV engine 394 shows the Software Selection component as Bond Management 448 and Derivative Management components 450 where the predicted asset output values are used to select assets sent to the Optimized Investment Units 452 component for further use.

Figure 28:
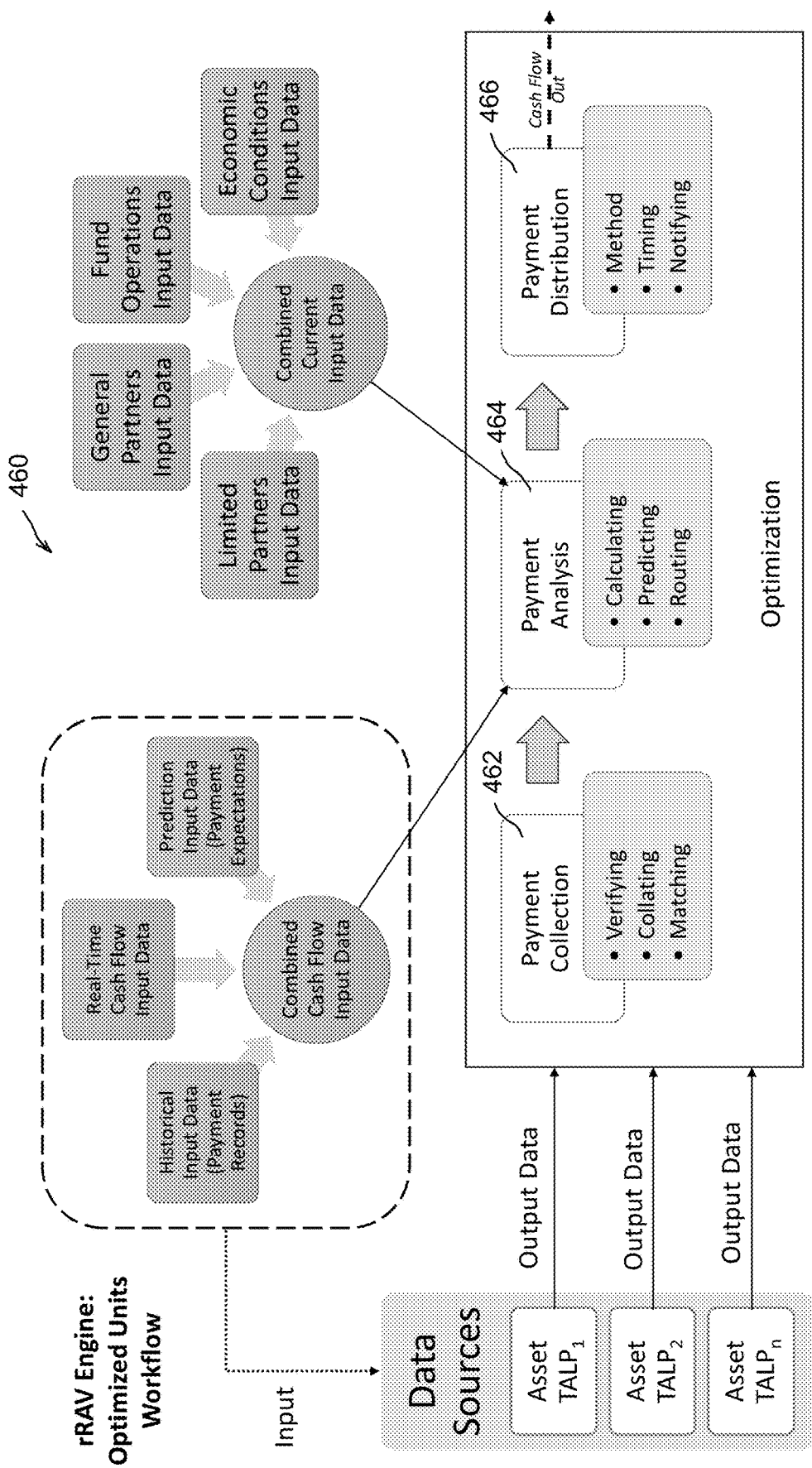
FIG. 28 shows the rRAV engine-optimized unit work flow wherein Investment Software has been converted into Asset TALPs with associated prediction polynomials whose output data is used for optimization, in accordance with embodiments of the present invention.

FIG. 28 shows an example of an rRAV engine work flow 460. Various input data sources are entered into the asset TALP that represents fund assets, generating predicted output data (payments, payment timings, principle, interest rates, capital call events, etc.). To optimize the set of pooled combined cashflow input data requires the combined current input data and the following:

1) Payment Collection 462: Verification, collation, and matching output data to required inputs to ensure that the received data is associated with the correct partner and asset.
2) Payment Analysis 464: Calculating, predicting, and routing, using the current data combined with predicted data to ensure that the future minimum and maximums for each asset in each fund remains acceptable.
3) Payment Distribution 466: Method, timing, and notifying to ensure that the associated partners are notified of any predicted deviations in the output data of any asset, either in value or timing.

Figure 29:
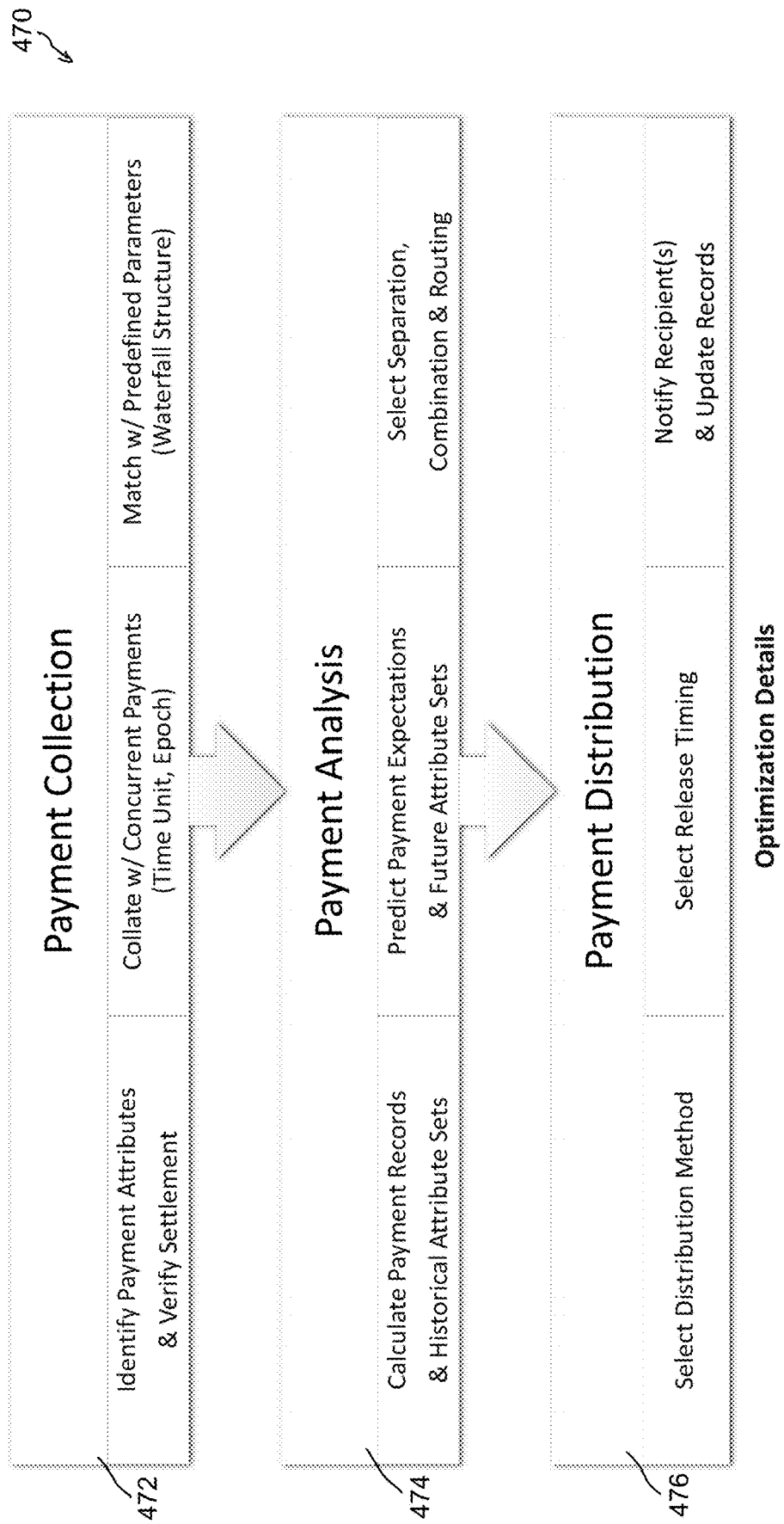
FIG. 29 shows a diagram detailing Asset TALP output data optimization from investment algorithms, in accordance with embodiments of the present invention.

FIG. 29 shows a diagram 470 with additional detail for the optimization portion of the rRAV Optimized engine work flow shown in FIG. 28.

1) Payment Collection 472: Identify an asset's payment attributes then verify the settlement of the received payment; collate with concurrent asset payments including unit time and current epoch; and match with predefined parameters.
2) Payment Analysis 474: Calculate and save records and historical attributes; predict payment expectations and future asset attribute sets; and select the partners that will receive payment and other asset attribute information.
3) Payment Distribution 476: Select distribution method and distribution timing and send notifications to the correct partner.

Figure 30:
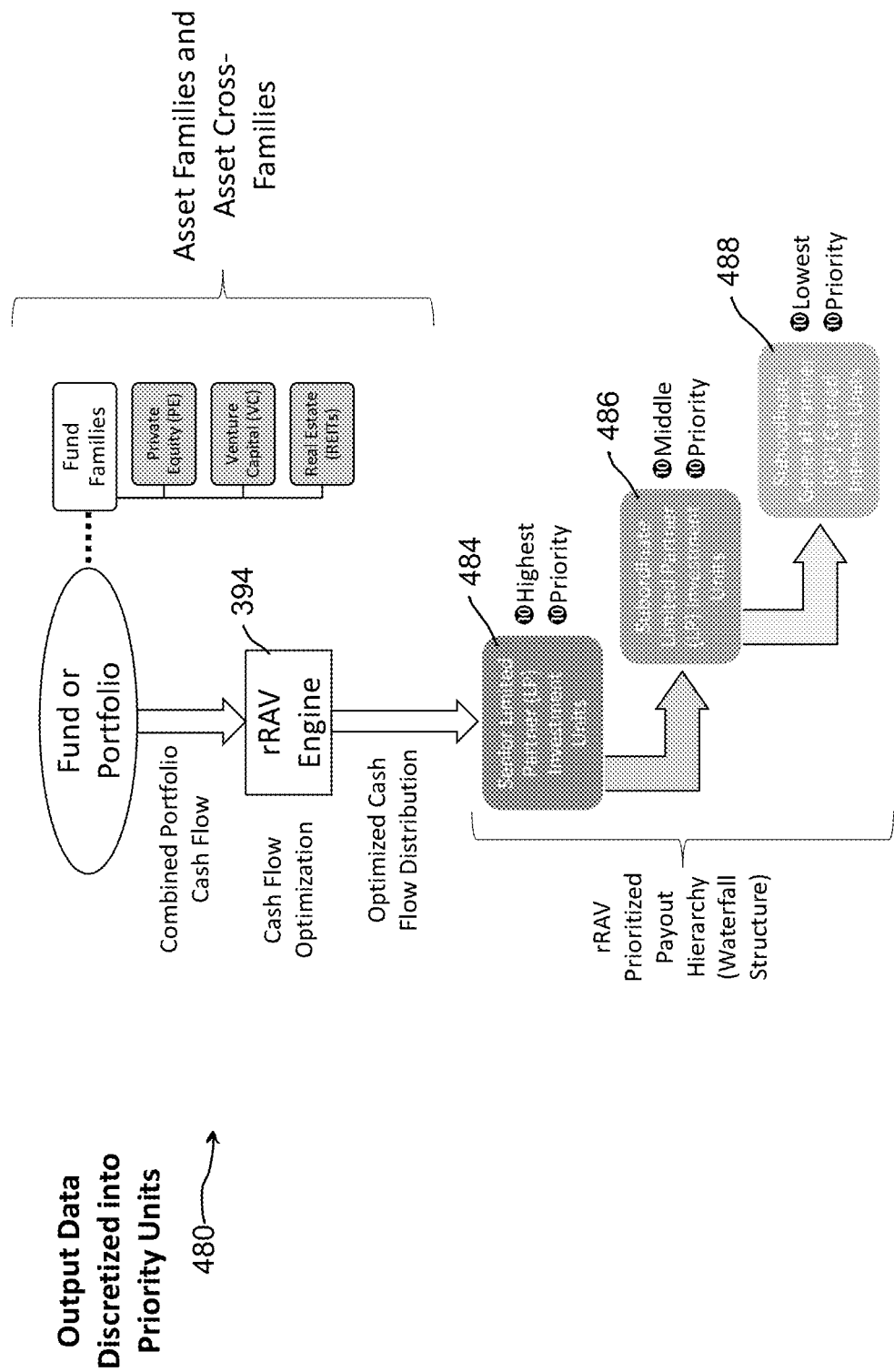
FIG. 30 shows a diagram detailing the conversion of optimized Asset TALP output data, such as cash flow from pooled investment funds, to various priority units, in accordance with embodiments of the present invention.

FIG. 30 shows an example 480 of the rRAV engine 394 discretizing the Fund or Portfolio asset output values into multiple types of Investment Units, with only the cash flow output dataset shown. These units are called prioritized payouts because distribution to a succeeding unit type only occurs after the payout to the preceding Investment Unit type. The Senior Limited Partner 484 is shown as having the highest priority, receiving the payout for these units first. The Subordinate Limited Partner 486 (sometimes called the Junior Limited Partner) is paid out next, followed by the General Partner 488.

Figure 31:
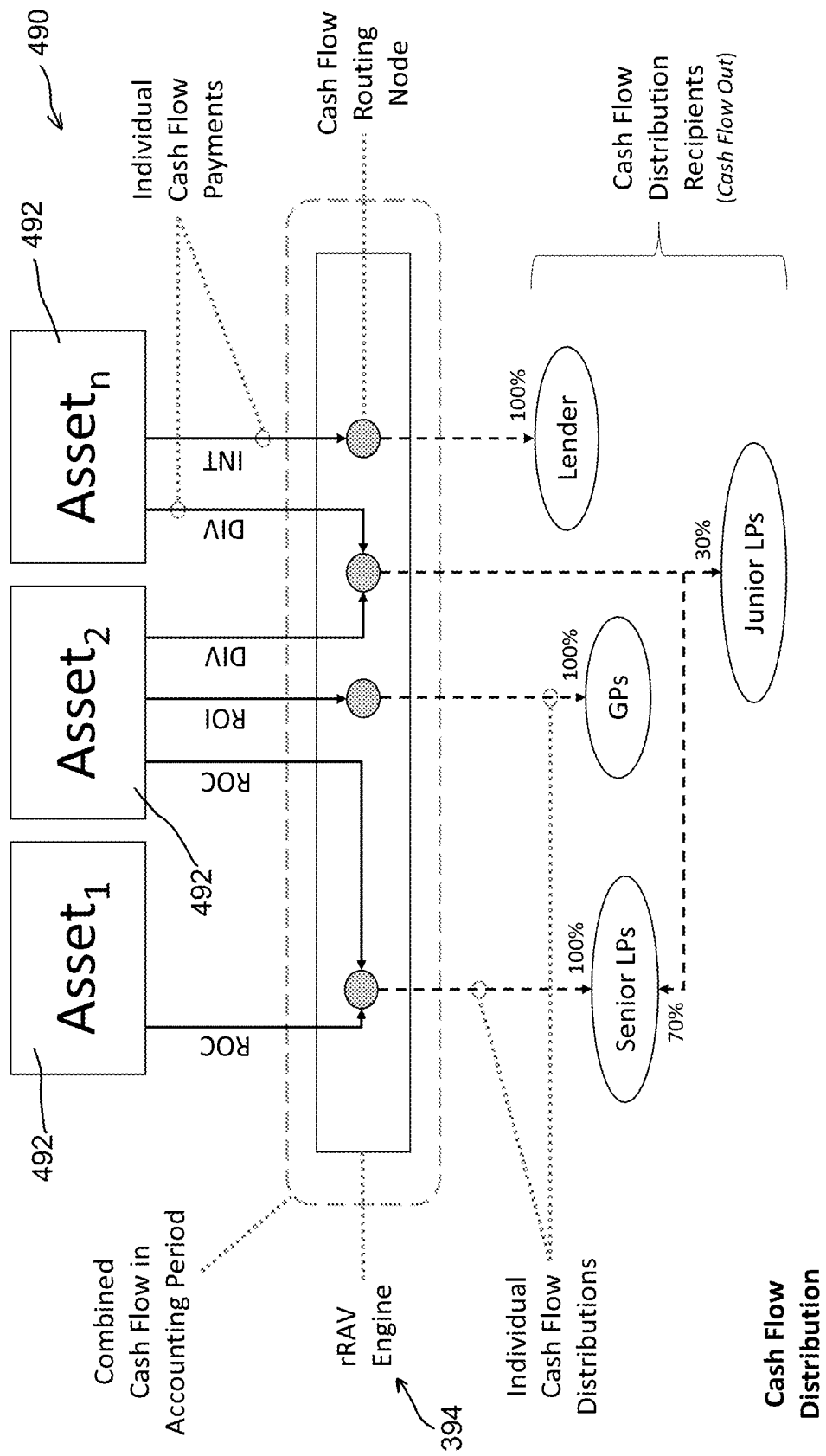
FIG. 31 shows a diagram detailing the distribution of various pooled Asset TALP output data from investment algorithms to various user classes: Senior LPs, Junior LPs, and GPs, in accordance with embodiments of the present invention.

FIG. 31 shows an example 490 of assets 492 from Asset Families or Asset Cross-Families pooled, discretized and optimized into Investment Units in the rRAV engine 394 for General Partners, Senior Limited Partners, Junior Limited Partners, and others, using various assets with different percentages allocated to different partnership categories.

Figure 32:
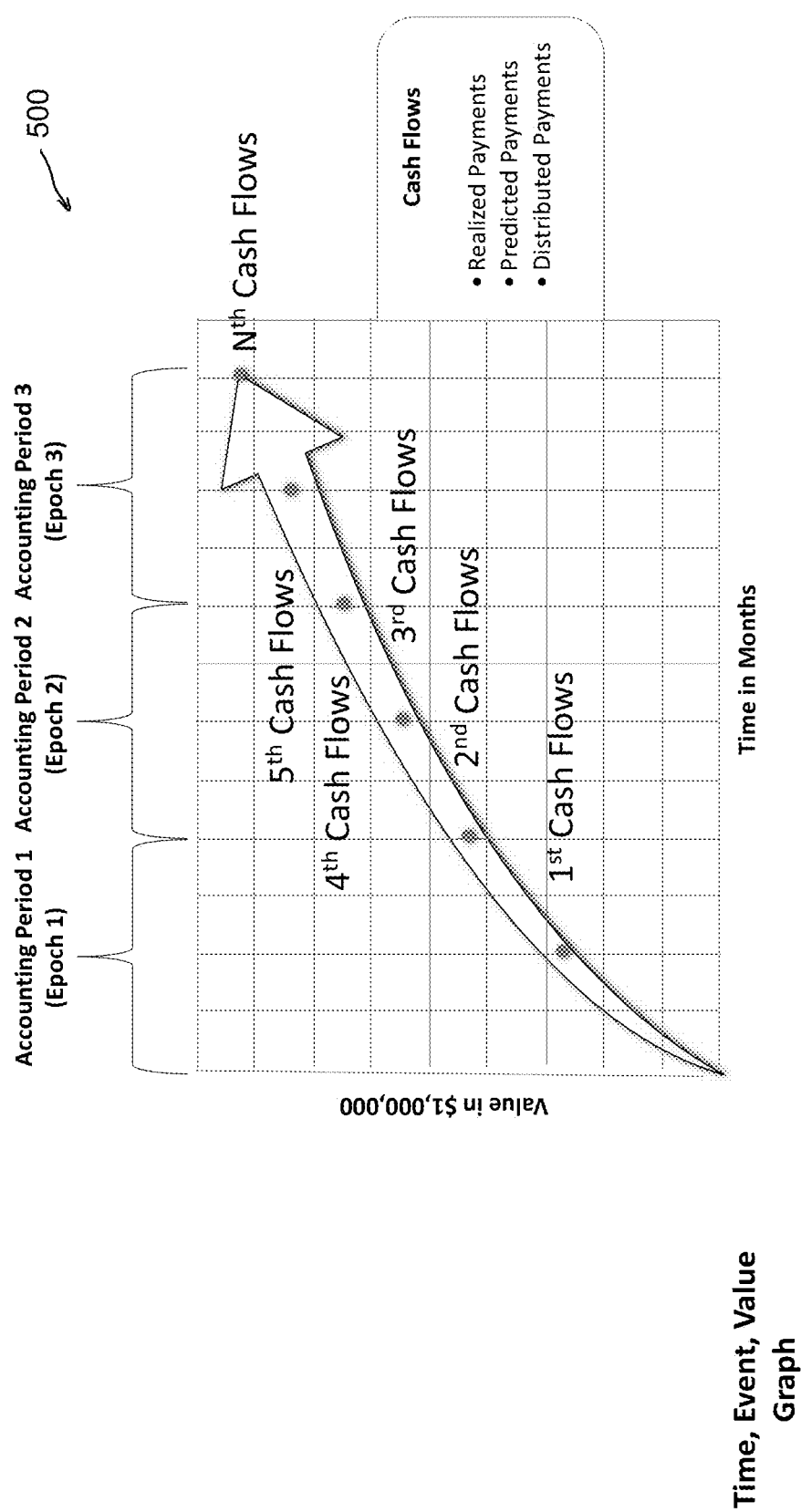
FIG. 32 shows a graph depicting the use of Advanced Time Complexity and Value Complexity to predict investment fund valuations over time, in accordance with embodiments of the present invention.

FIG. 32 shows a graph 500 of predicted asset values over time, breaking up the asset lifetime into epochs and showing multiple output events (cashflows). Predictions can be generated using the prediction polynomials associated with an asset TALP and viewed by partners for any asset TALP, asset Family, or asset Cross-Family.

Various concepts, systems, and methods of the present invention can include a method and system of software enhancement and management that comprises inputting one or more data transformation algorithms, wherein the one or more data transformation algorithms do not include software application source code, decomposing the one or more data transformation algorithms into a plurality of TALPS, executing the plurality of TALPs using a set of test data to generate associated value complexity prediction polynomials, advanced time complexity prediction polynomials, and advanced space complexity prediction polynomials, simulating TALP behavior by executing the generated, associated prediction polynomials, selecting one or more of the plurality of TALPs based on acceptance criteria, wherein the acceptance criteria includes one or more expected input to output value ranges, one or more expected TALP execution timings, and one or more expected TALP memory allocation requirements, modeling one or more outcomes with actual expected input data values using the value complexity prediction polynomials, the advanced time complexity prediction polynomials, and the advanced space complexity prediction polynomials for each of the selected one or more TALPs, and defining optimum TALP groupings for solution sets.

In various embodiments, the acceptance criteria further includes enhancements.

In various embodiments, the method and system further comprises parallelizing the selected one or more of the plurality of TALPs.

In various embodiments, the method and system further comprises inputting TALP Family Selection criteria.

In various embodiments, the method and system further comprises grouping the selected one or more of the plurality of TALPs into TALP Families based on the TALP Family Selection criteria.

In various embodiments, one or more of the grouped TALP families are included in one or more TALP Cross-Families.

In various embodiments, the TALP Family Selection criteria is inputted from a System Operator. In various embodiments, the one or more data transformation algorithms include asset algorithms.

In various embodiments, the plurality of TALPs are a plurality of asset TALPs.

In various embodiments, the acceptance criteria includes asset acceptance criteria used in selecting the one or more of the plurality of TALPs.

In one or more embodiments, a system of the present invention comprises a processor configured to execute program code stored in memory, operatively coupled with the processor, to: input one or more data transformation algorithms, wherein the one or more data transformation algorithms do not include software application source code; decompose the one or more data transformation algorithms into a plurality of TALPs; execute the plurality of TALPs using a set of test data to generate associated value complexity prediction polynomials, advanced time complexity prediction polynomials, and advanced space complexity prediction polynomials; simulate TALP behavior by executing the generated, associated prediction polynomials; select one or more of the plurality of TALPs based on acceptance criteria, wherein the acceptance criteria includes one or more expected input to output value ranges, one or more expected TALP execution timings, and one or more expected TALP memory allocation requirements; model one or more outcomes with actual expected input data values using the value complexity prediction polynomials, the advanced time complexity prediction polynomials, and the advanced space complexity prediction polynomials for each of the selected one or more TALPs; and define optimum TALP groupings for solution sets.

While various embodiments have been described above, it should be understood that they have been presented by way of example only, and not limitation. Thus, the breadth and scope of the present disclosure should not be limited by any on the above-described embodiments or examples. Moreover, any combination of the above-described elements in all possible variations thereof is encompassed by the disclosure unless otherwise indicated herein or otherwise clearly contradicted by context.

It is understood that any specific order or hierarchy of steps in any disclosed process is an example of a sample approach. Based upon design preferences, it is understood that the specific order or hierarchy of steps in the processes may be rearranged while remaining within the scope of the present disclosure. The accompanying method claims present elements of the various steps in a sample order and are not meant to be limited to the specific order or hierarchy presented.

While the present invention has been described in connection with various aspects and examples, it will be understood that the present invention is capable of further modifications. This application is intended to cover any variations, uses or adaptation of the invention following, in general, the principles of the invention, and including such departures from the present disclosure as come within the known and customary practice within the art to which the invention pertains.

It will be readily apparent to those of ordinary skill in the art that many modifications and equivalent arrangements can be made thereof without departing from the spirit and scope of the present disclosure, such scope to be accorded the broadest interpretation of the appended claims so as to encompass all equivalent structures and products.

For purposes of interpreting the claims for the present invention, it is expressly intended that the provisions of 35 U.S.C. § 112(f) are not to be invoked unless the specific terms "means for" or "step for" are recited in a claim.

What is claimed is:

1. A method of software enhancement and management, comprising:
   inputting one or more data transformation algorithms representing asset data;
   decomposing the one or more data transformation algorithms into a plurality of time-affecting linear pathways (TALPs);
   executing the plurality of TALPs to generate at least one or more value complexity prediction polynomials;
   modeling a chained unit system of one or more preceding temporally sequenced TALP investment units and one or more succeeding temporally sequenced TALP investment units based at least on the one or more value complexity prediction polynomials;
   simulating the chained unit system of the one or more preceding temporally sequenced TALP investment units and the one or more succeeding temporally sequenced TALP investment units to optimize one or more predictive algorithmic output values based at least on acceptance criteria, wherein the acceptance criteria includes one or more acceptable input values and one or more acceptable output values; and
   outputting optimized temporally sequenced TALP investment data from the one or more predictive algorithmic output values.

2. The method of claim 1, further comprising generating one or more advanced time complexity prediction polynomials to determine execution of chained TALPs, wherein each of the chained TALPs include a different starting time.

3. The method of claim 1, further comprising generating one or more advanced space complexity prediction polynomials to predict memory allocation.

4. The method of claim 1, wherein the modeling of the chained unit system further comprises using at least one of one or more advanced time complexity prediction polynomials and one or more advanced space complexity prediction polynomials.

5. The method of claim 1, wherein the modeling of the chained unit system is processed via at least one of a Data Discretization Optimization (DDO) software engine and a Risk/Return Allocation Vehicle (rRAV) software engine.

6. The method of claim 1, wherein the outputted optimized temporally sequenced TALP investment data comprises at least one of: Private Equity (PE) fund data, venture fund data, Real Estate Investment Trust (REIT) data, capital call data, venture capital requirements data, prioritized investment units data, principle data, cash flow data, payment data, payment timing data, and interest data.

7. The method of claim 1, wherein the outputted optimized temporally sequenced TALP investment data comprises at least one of: investment return data, investment risk data, bond rater data, rating agency data, derivative data, securities data, multiple assets data, and multiple securities data.

8. The method of claim 1, wherein the outputted optimized temporally sequenced TALP investment data comprises data for multiple investment portfolios or multiple investment families.

9. The method of claim 1, wherein the acceptance criteria further comprises at least one of: asset acceptance criteria, venture capital requirements criteria, investment acceptance criteria, investment return criteria, investment risk criteria, bond rater criteria, rating agency criteria, and economic conditions data.

10. The method of claim 1, wherein the acceptance criteria is based at least on input values received from a general partner, a limited partner, a bond investor, or a rating agency.

11. The method of claim 1, wherein the modeling of the chained unit system occurs at one of a stand-alone server system, a client-server system, or a cloud-based server system.

12. A software enhancement and management system, comprising:
   a memory; and
   a processor operatively coupled to the memory, wherein the processor is configured to execute a program code to:
      input one or more data transformation algorithms representing asset data;
      decompose the one or more data transformation algorithms into a plurality of time-affecting linear pathways (TALPs);
      execute the plurality of TALPs to generate at least one or more value complexity prediction polynomials;
      model a chained unit system of one or more preceding temporally sequenced TALP investment units and one or more succeeding temporally sequenced TALP investment units based at least on the one or more value complexity prediction polynomials;
      simulate the chained unit system of the one or more preceding temporally sequenced TALP investment units and the one or more succeeding temporally sequenced TALP investment units to optimize one or more predictive algorithmic output values based at least on acceptance criteria, wherein the acceptance criteria includes one or more acceptable input values and one or more acceptable output values; and
      output optimized temporally sequenced TALP investment data from the one or more predictive algorithmic output values.

13. The system of claim 12, wherein the processor is further configured to execute the program code to generate one or more advanced time complexity prediction polynomials to determine execution of chained TALPs, wherein each of the chained TALPs include a different starting time.

14. The system of claim 12, wherein the processor is further configured to execute the program code to generate one or more advanced space complexity prediction polynomials to predict memory allocation.

15. The system of claim 12, wherein the modeling of the chained unit system further comprises using at least one of: one or more advanced time complexity prediction polynomials and one or more advanced space complexity prediction polynomials.

16. The system of claim 12, wherein the modeling of the chained unit system is processed via at least one of a Data Discretization Optimization (DDO) software engine and a Risk/Return Allocation Vehicle (rRAV) software engine.

17. The system of claim 12, wherein the outputted optimized temporally sequenced TALP investment data comprises at least one of: Private Equity (PE) fund data, venture fund data, bond rater data, rating agency data, asset structure data, Real Estate Investment Trust (REIT) data, capital call data, venture capital requirements data, prioritized investment units data, principle data, cash flow data, payment data, payment timing data, interest data, investment return data, investment risk data, derivative data, securities data, multiple assets data, multiple securities data, multiple investment portfolios data, and multiple investment families data.

18. The system of claim 12, wherein the acceptance criteria further comprises at least one of: asset acceptance criteria, venture capital requirements criteria, investment acceptance criteria, investment return criteria, investment risk criteria, bond rater criteria, rating agency criteria, and economic conditions data.

19. The system of claim 12, wherein the acceptance criteria is based at least on input values received from a general partner, a limited partner, a bond investor, or a rating agency.

20. The system of claim 12, wherein the modeling of the chained unit system occurs at one of a stand-alone server system, a client-server system, or a cloud-based server system.

* * * * *